United States Patent
Chu et al.

(10) Patent No.: US 11,756,995 B2
(45) Date of Patent: Sep. 12, 2023

(54) METHOD OF FORMING A SEMICONDUCTOR DEVICE STRUCTURE HAVING AN ISOLATION LAYER TO ISOLATE A CONDUCTIVE FEATURE AND A GATE ELECTRODE LAYER

(71) Applicant: TAIWAN SEMICONDUCTOR MANUFACTURING COMPANY, LTD., Hsinchu (TW)

(72) Inventors: Lung-Kun Chu, New Taipei (TW); Mao-Lin Huang, Hsinchu (TW); Chung-Wei Hsu, Hsinchu (TW); Jia-Ni Yu, New Taipei (TW); Kuan-Lun Cheng, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 120 days.

(21) Appl. No.: 17/459,379

(22) Filed: Aug. 27, 2021

(65) Prior Publication Data

US 2023/0061676 A1 Mar. 2, 2023

(51) Int. Cl.
*H01L 29/06* (2006.01)
*H01L 21/8234* (2006.01)
(Continued)

(52) U.S. Cl.
CPC .. *H01L 29/0665* (2013.01); *H01L 21/823418* (2013.01); *H01L 21/823481* (2013.01); *H01L 29/0649* (2013.01); *H01L 29/0847* (2013.01)

(58) Field of Classification Search
CPC ..... H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 29/42392; H01L 29/0665; H01L 29/0669; H01L 29/0673; H01L 21/823481; H01L 21/823878;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Sonya McCall-Shepard
(74) *Attorney, Agent, or Firm* — NZ Carr Law Office

(57) ABSTRACT

A semiconductor device structure, along with methods of forming such, are described. The structure includes first and second dielectric features and a first semiconductor layer disposed between the first and second dielectric features. The structure further includes an isolation layer disposed between the first and second dielectric features, and the isolation layer is in contact with the first and second dielectric features. The first semiconductor layer is disposed over the isolation layer. The structure further includes a gate dielectric layer disposed over the isolation layer and a gate electrode layer disposed over the gate dielectric layer. The gate electrode layer has an end extending to a level between a first plane defined by a first surface of the first semiconductor layer and a second plane defined by a second surface opposite the first surface.

20 Claims, 23 Drawing Sheets

(51) Int. Cl.
*H01L 29/775* (2006.01)
*H01L 21/8238* (2006.01)
*H01L 21/822* (2006.01)
*H01L 27/06* (2006.01)
*H01L 27/088* (2006.01)
*H01L 27/092* (2006.01)
*H01L 29/08* (2006.01)

(58) Field of Classification Search
CPC ......... H01L 21/28158; H01L 21/28255; H01L 21/28264; H01L 21/027; H01L 21/0332; H01L 21/0334; H01L 21/0335; H01L 21/32; H01L 21/308; H01L 21/3081; H01L 21/3083; H01L 21/31; H01L 21/311–31144; H01L 21/31053; H01L 21/31055; H01L 21/31056; H01L 21/469; H01L 21/475; H01L 21/47573; H01L 29/0642; H01L 29/0649; H01L 29/0653; H01L 21/823418; H01L 29/0847; H01L 21/823475; H01L 21/823871; H01L 29/66439; H01L 29/775; H01L 29/78696; H01L 23/5226; H01L 23/5286; H01L 21/76897; H01L 21/8221; H01L 27/0688; H01L 21/823814; H01L 27/088; H01L 27/092

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0357884 A1* | 11/2020 | Xie ........................ H01L 29/165 |
| 2021/0193797 A1* | 6/2021 | Xie ........................ H01L 29/0665 |
| 2022/0139911 A1* | 5/2022 | Wei ........................ H01L 27/0886 257/365 |

\* cited by examiner

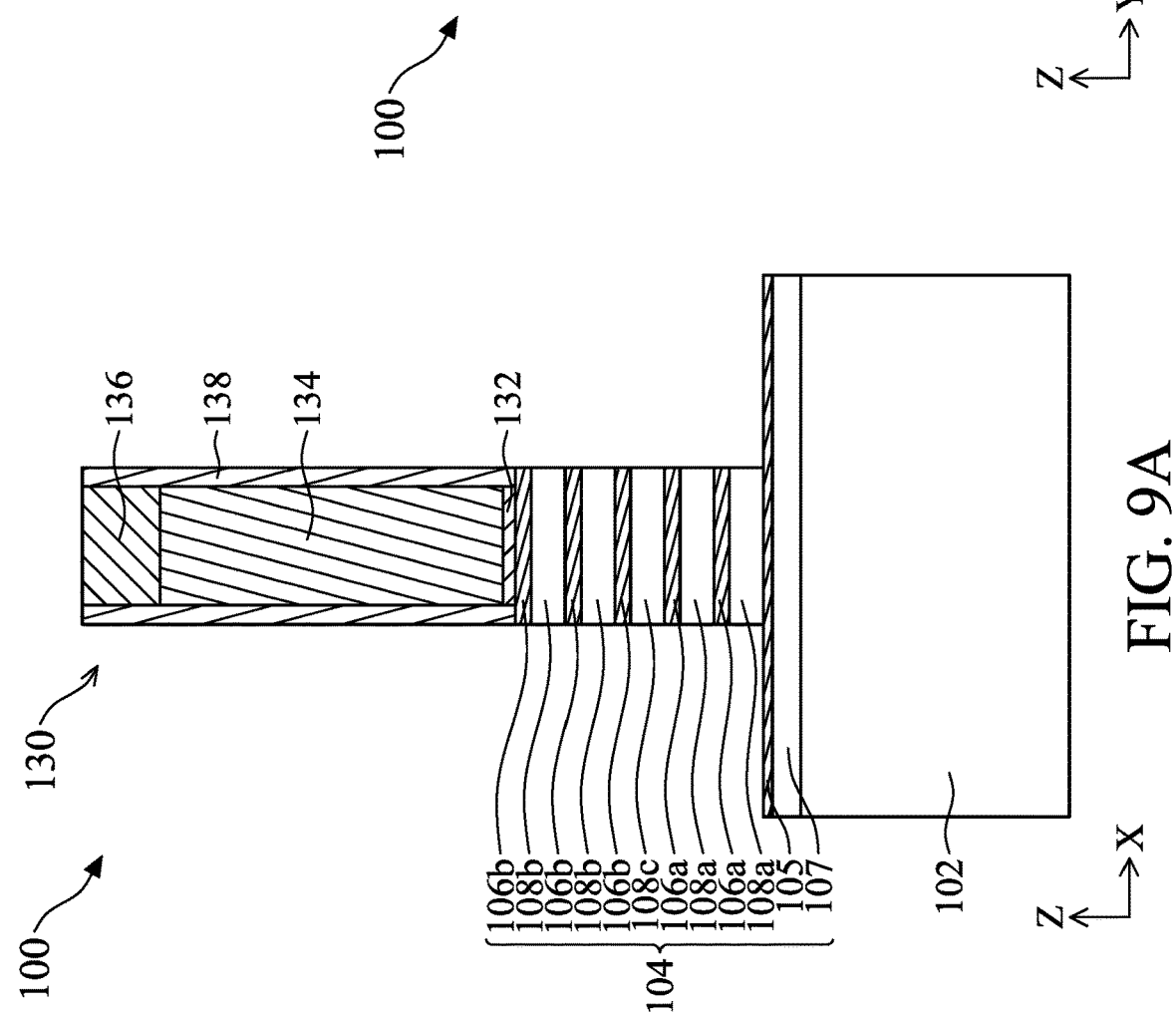
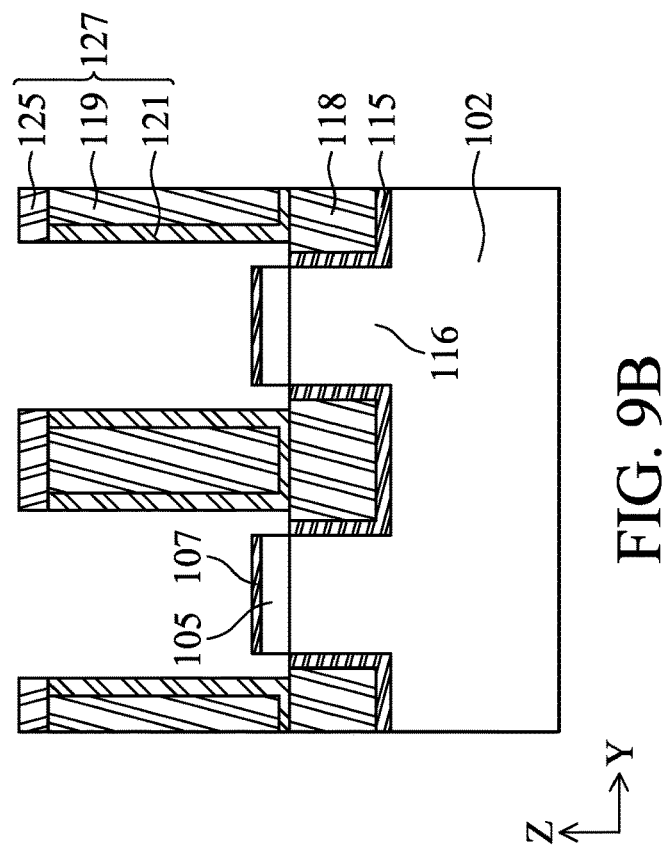
FIG. 9A
FIG. 9B

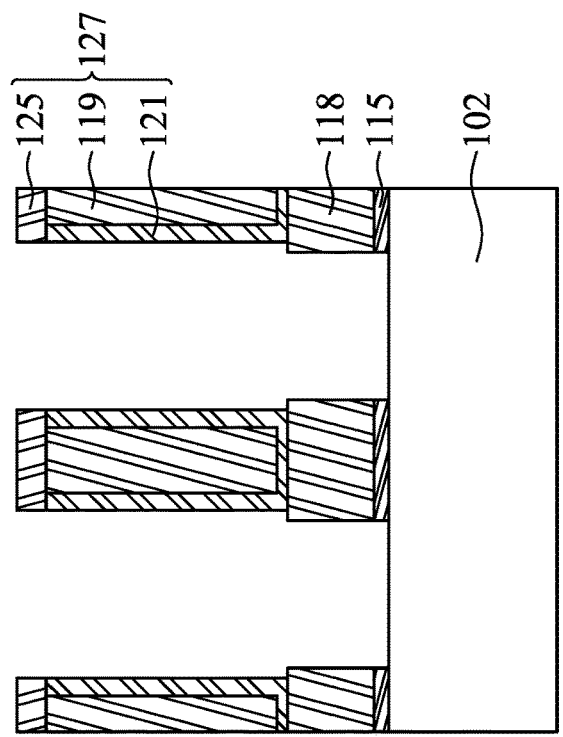
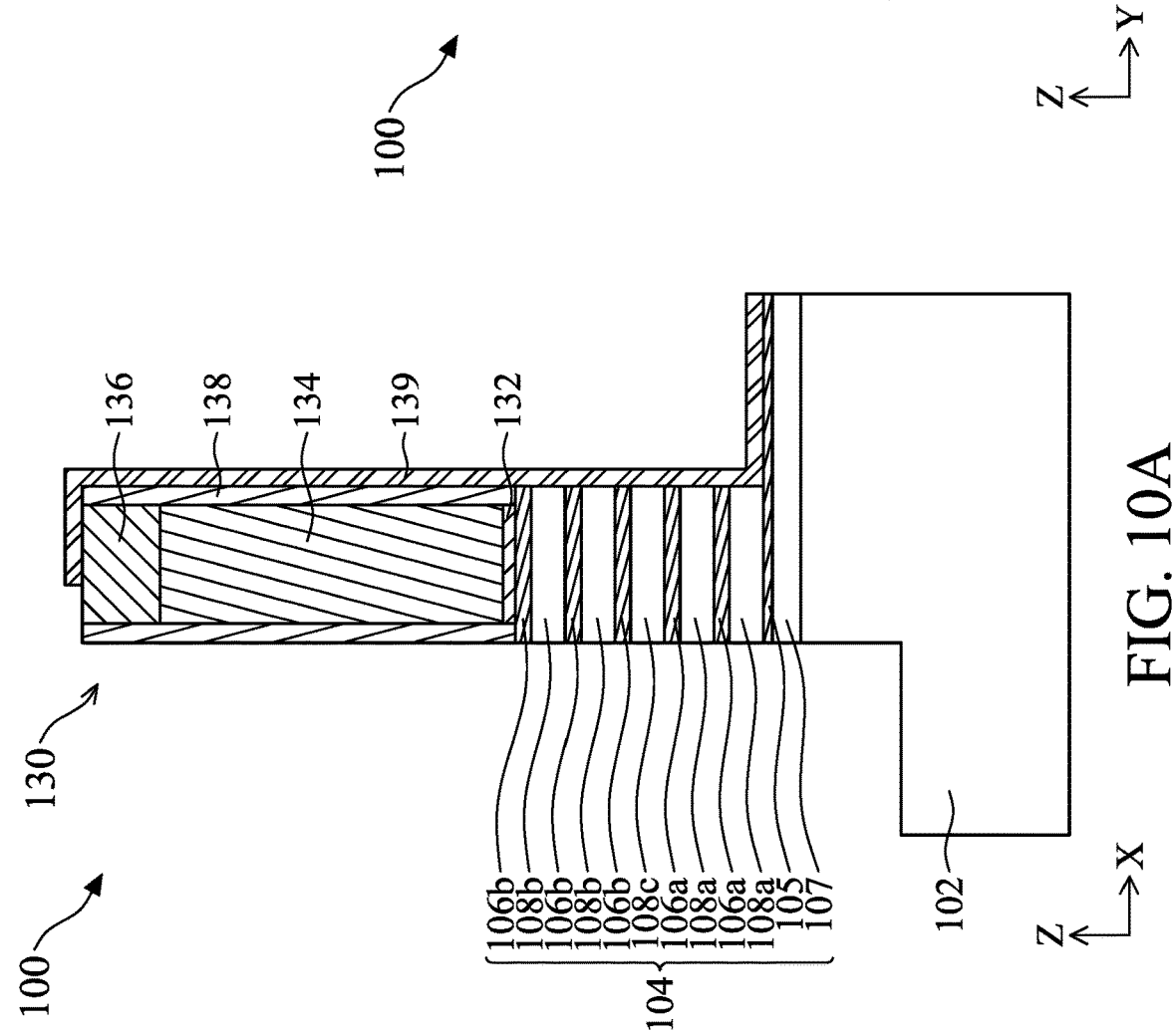
FIG. 10A
FIG. 10B

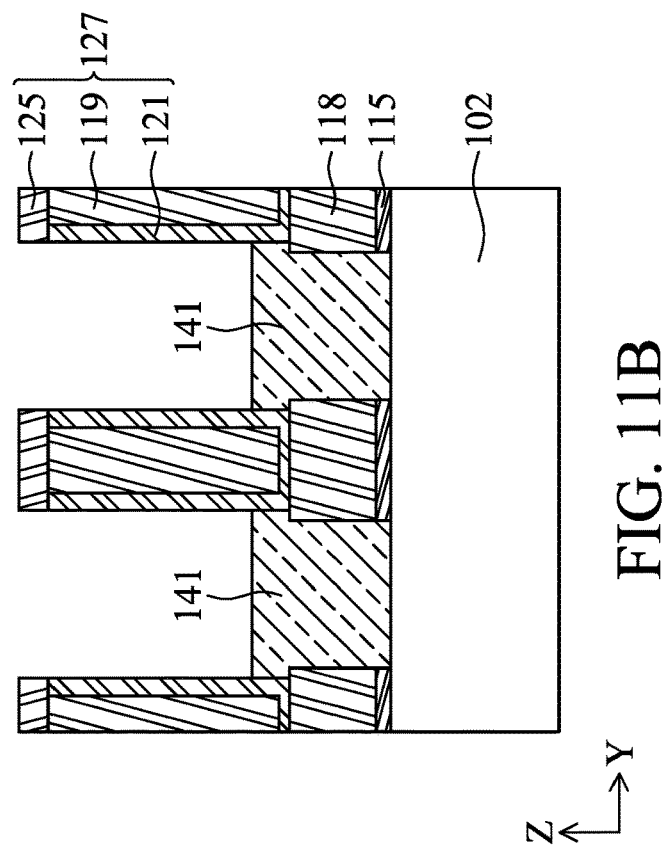
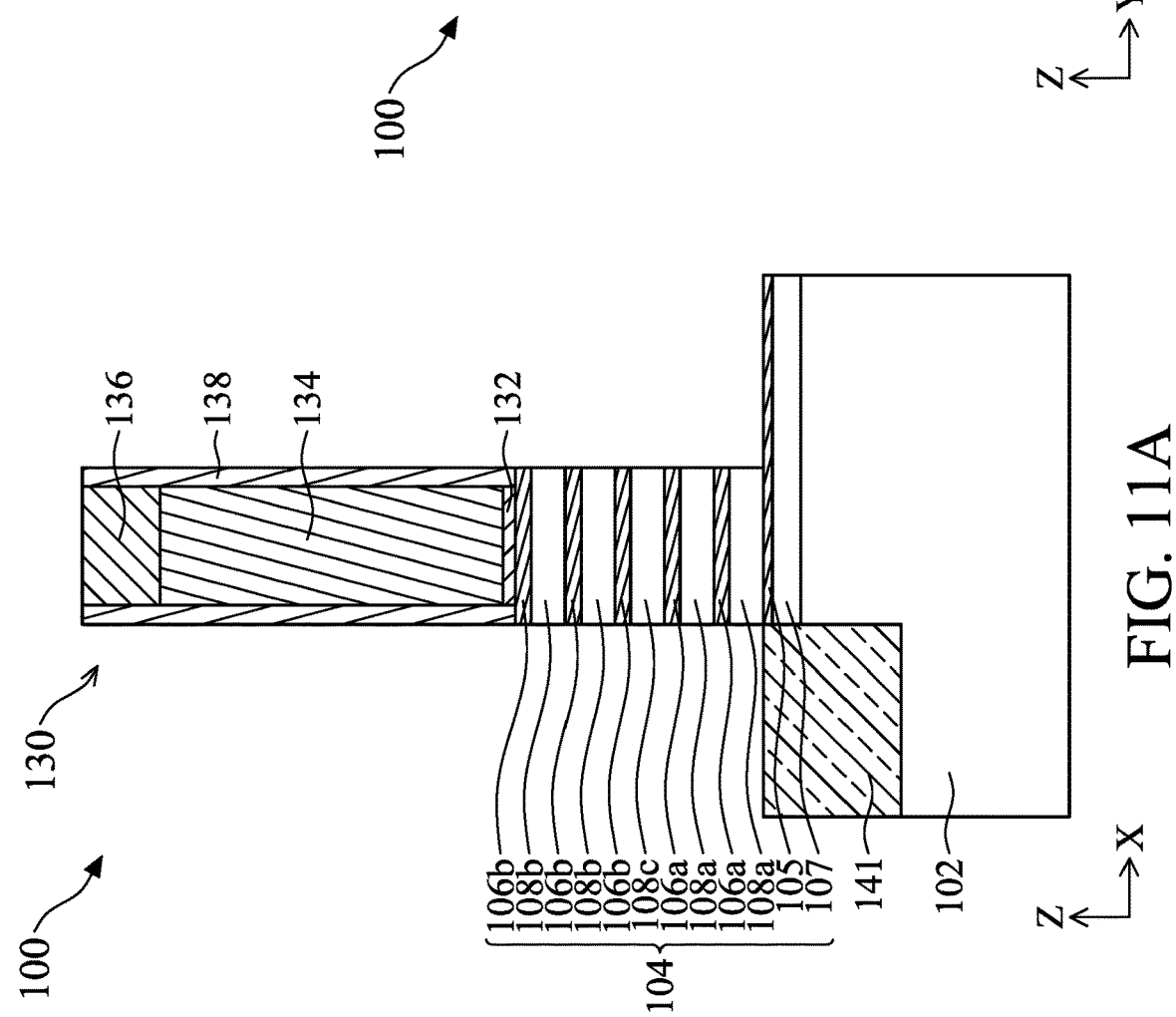
FIG. 11A
FIG. 11B

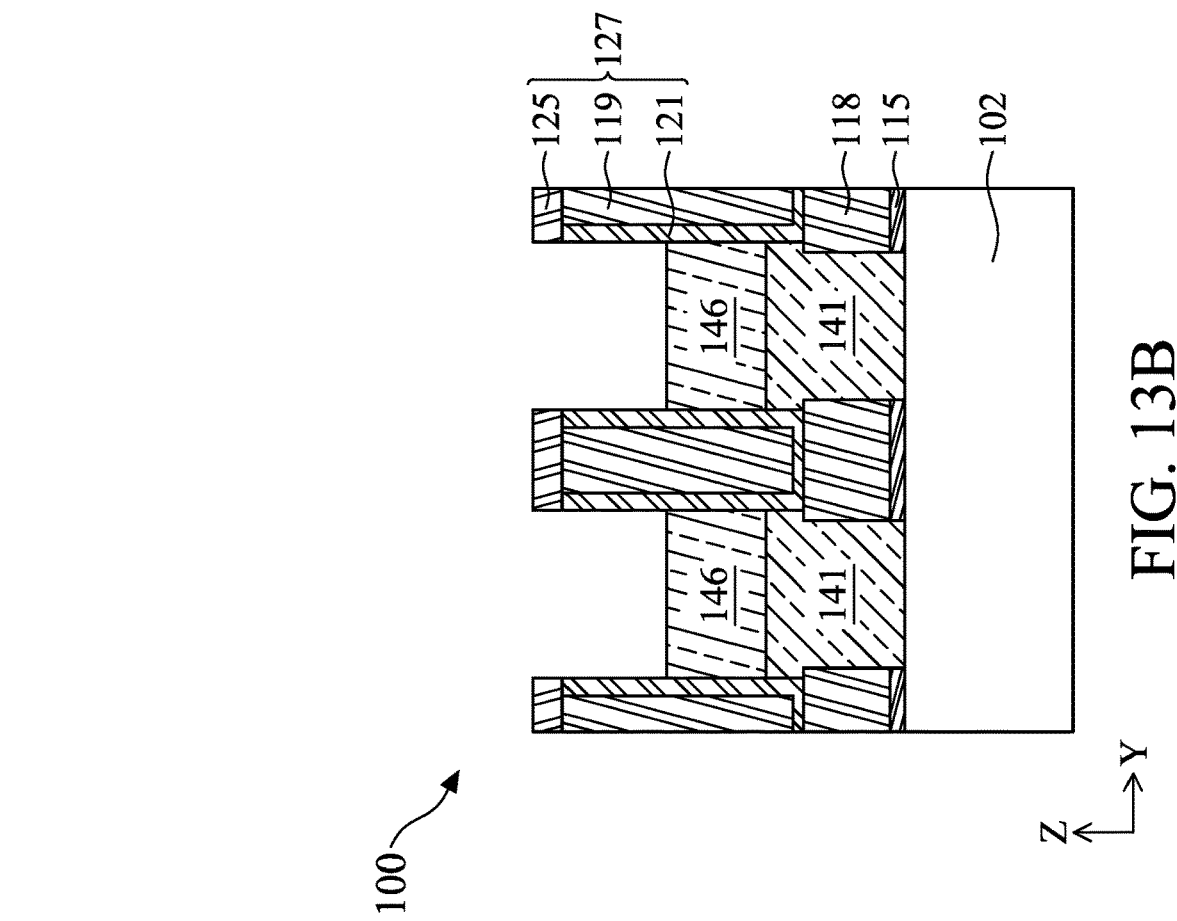
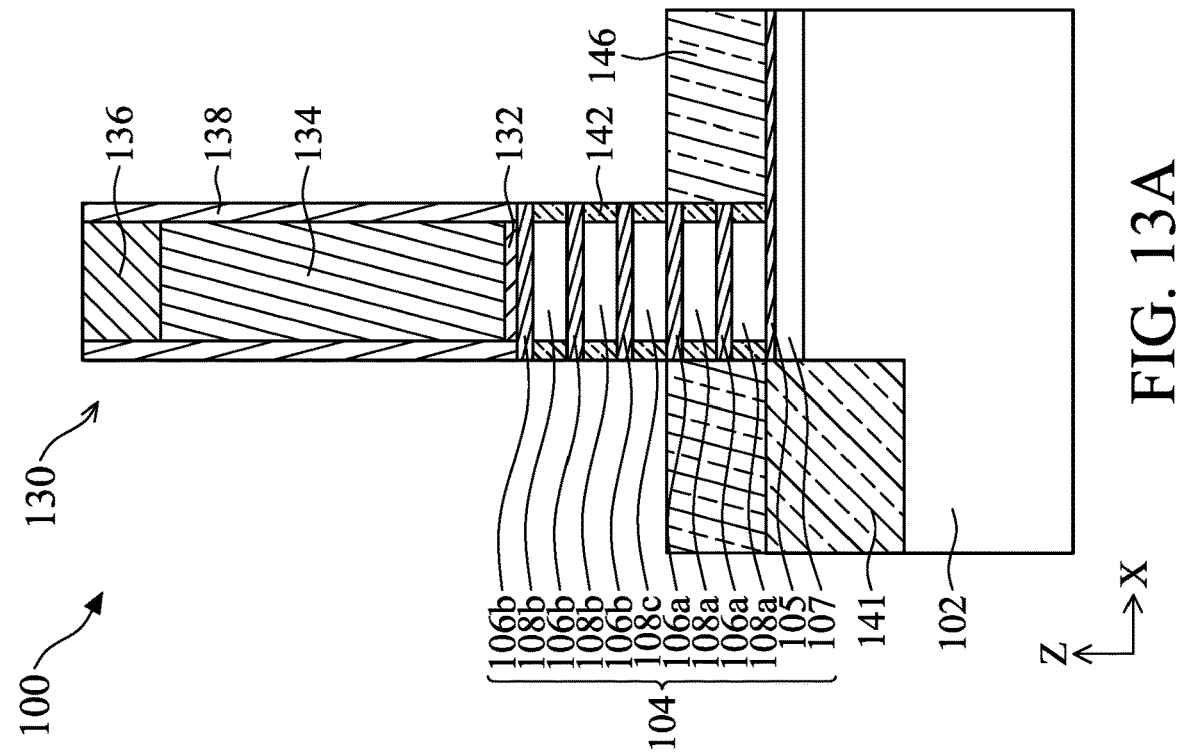
FIG. 13A
FIG. 13B

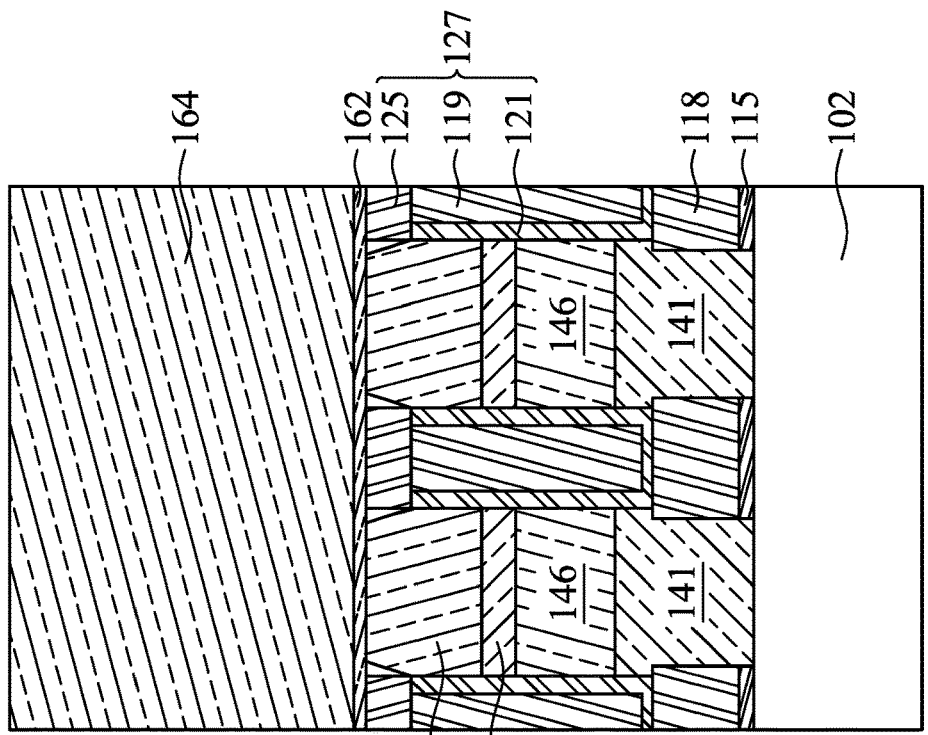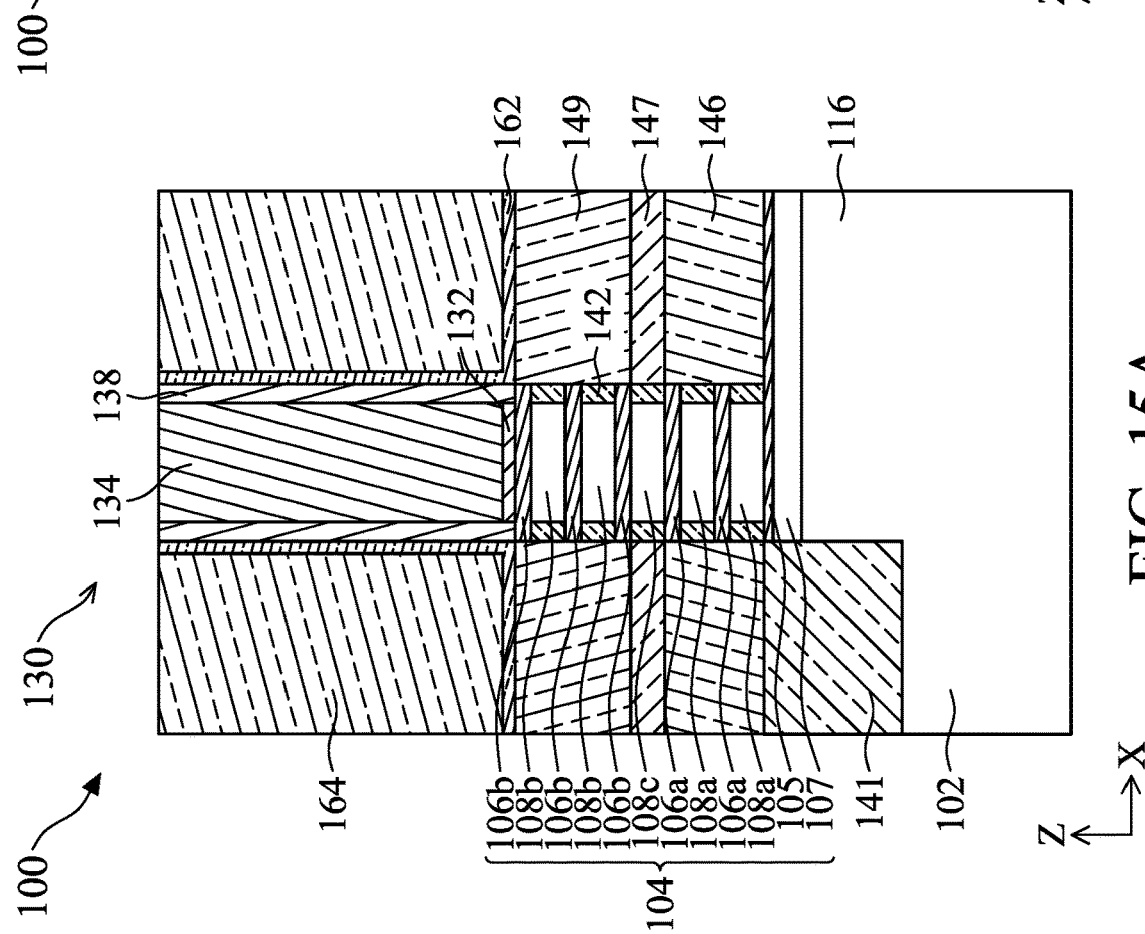
FIG. 15A
FIG. 15B

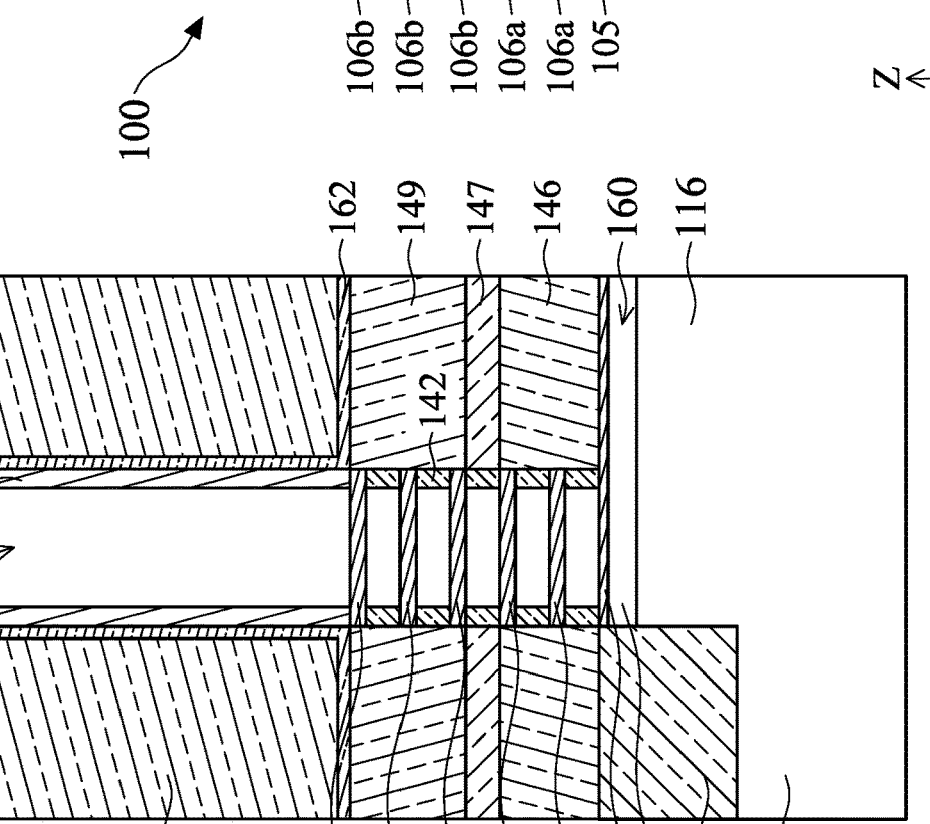
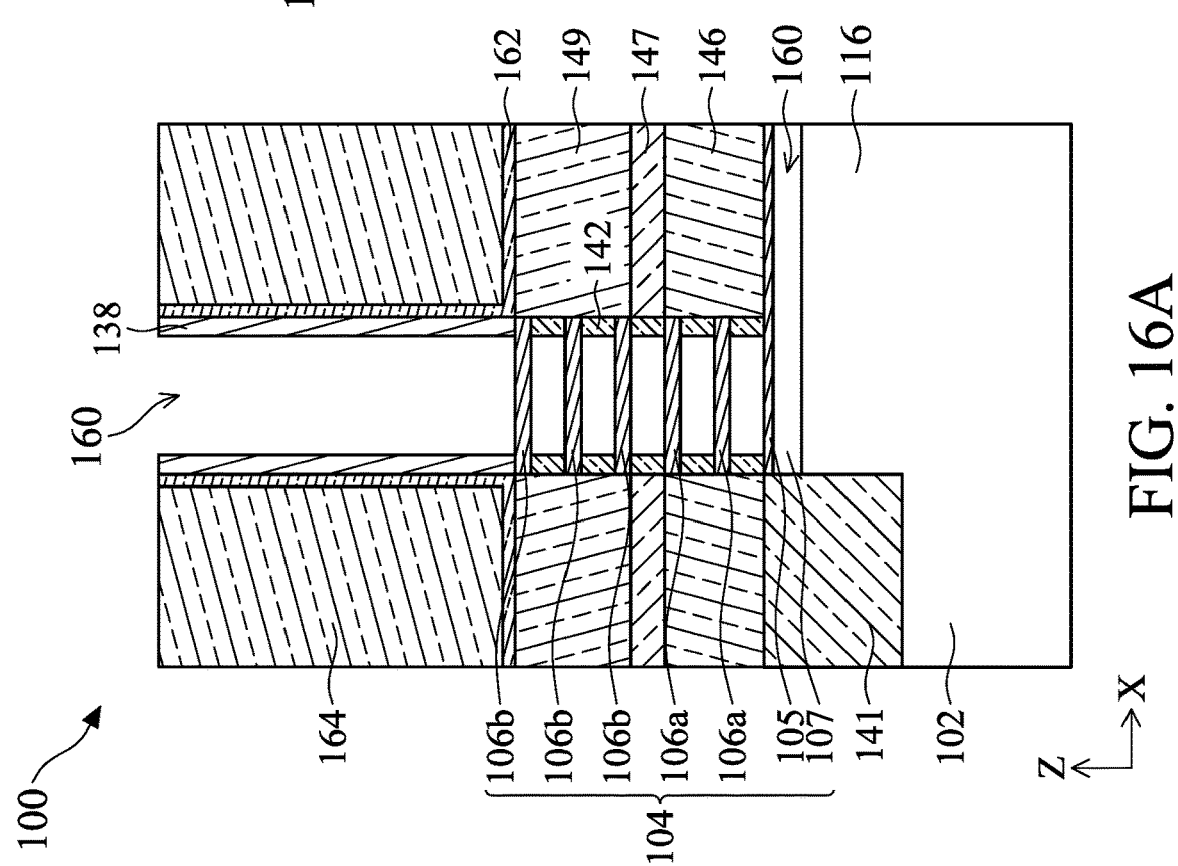
FIG. 16A
FIG. 16B

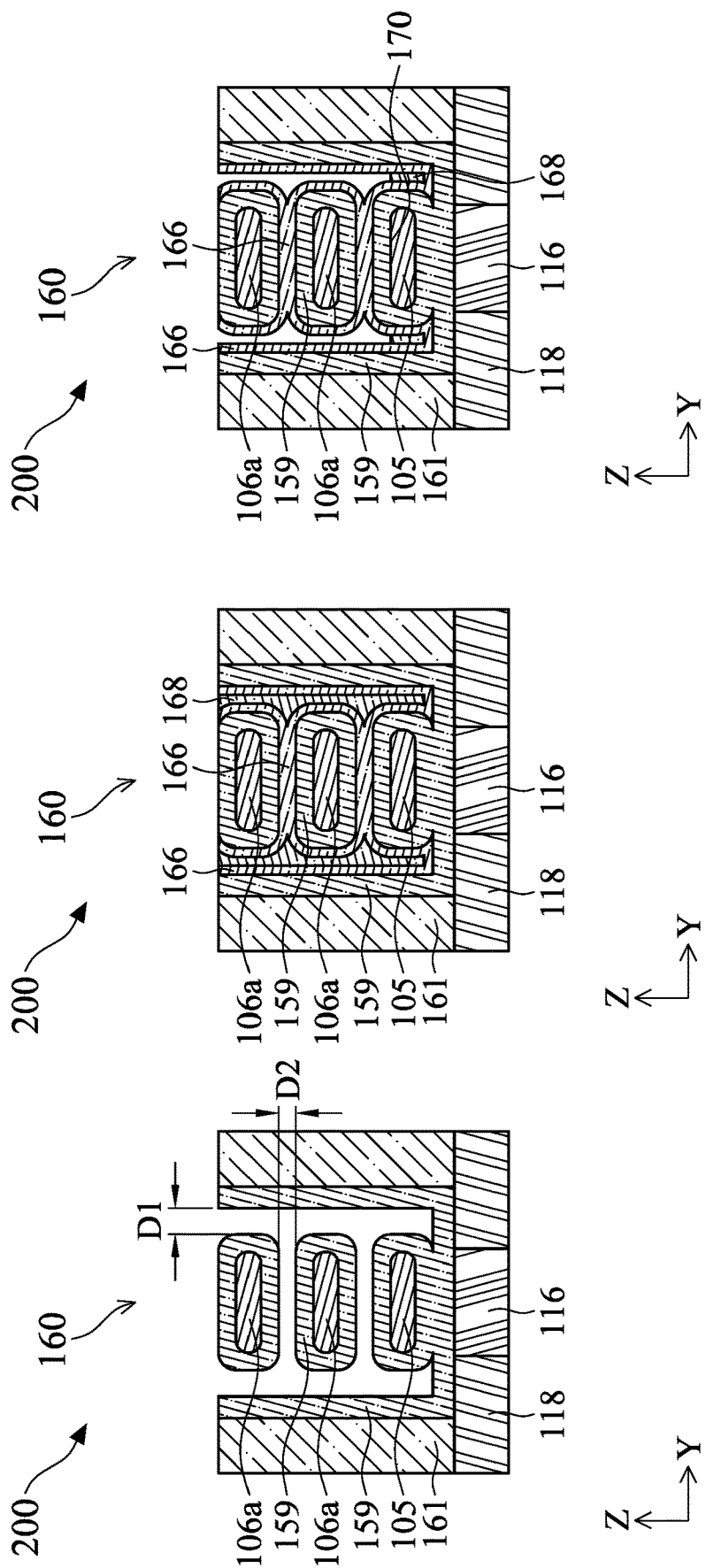

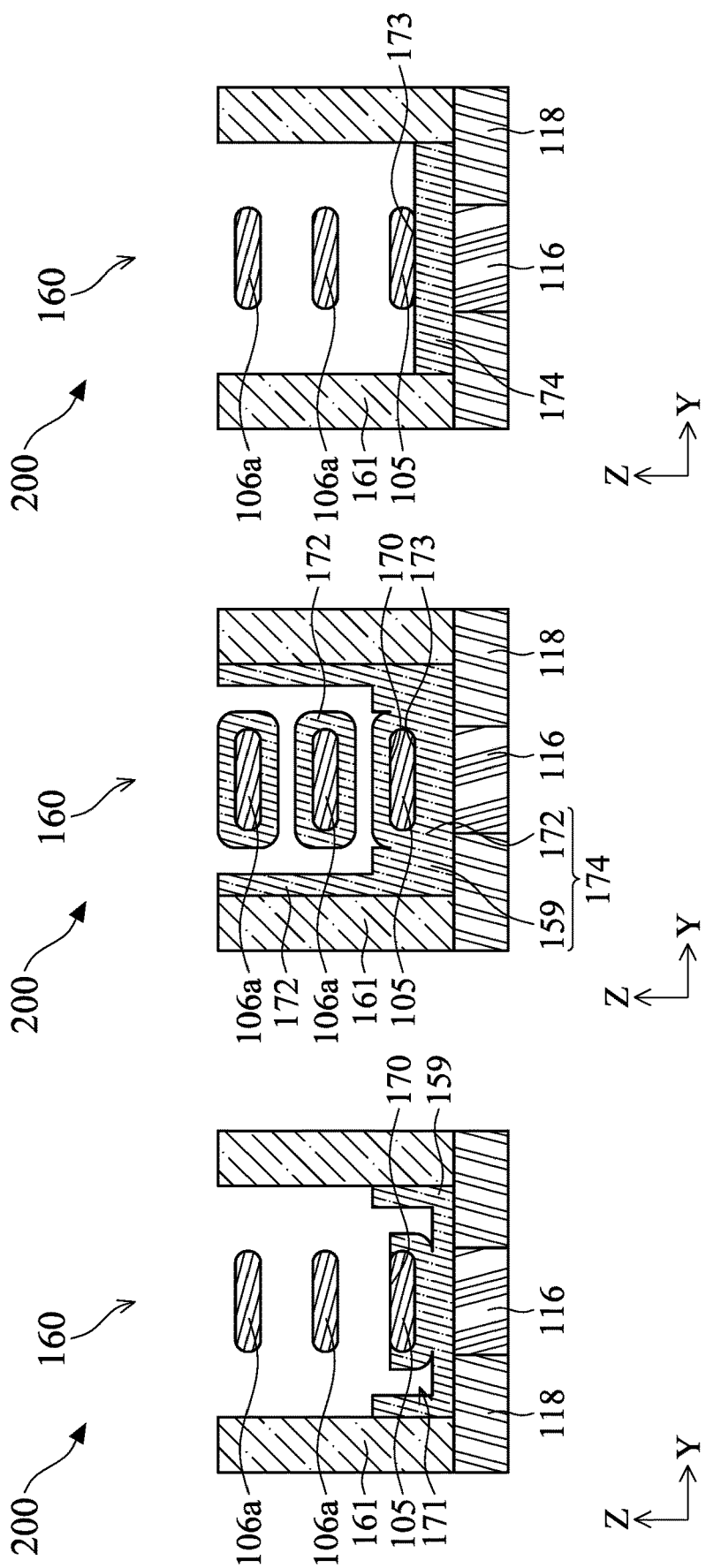

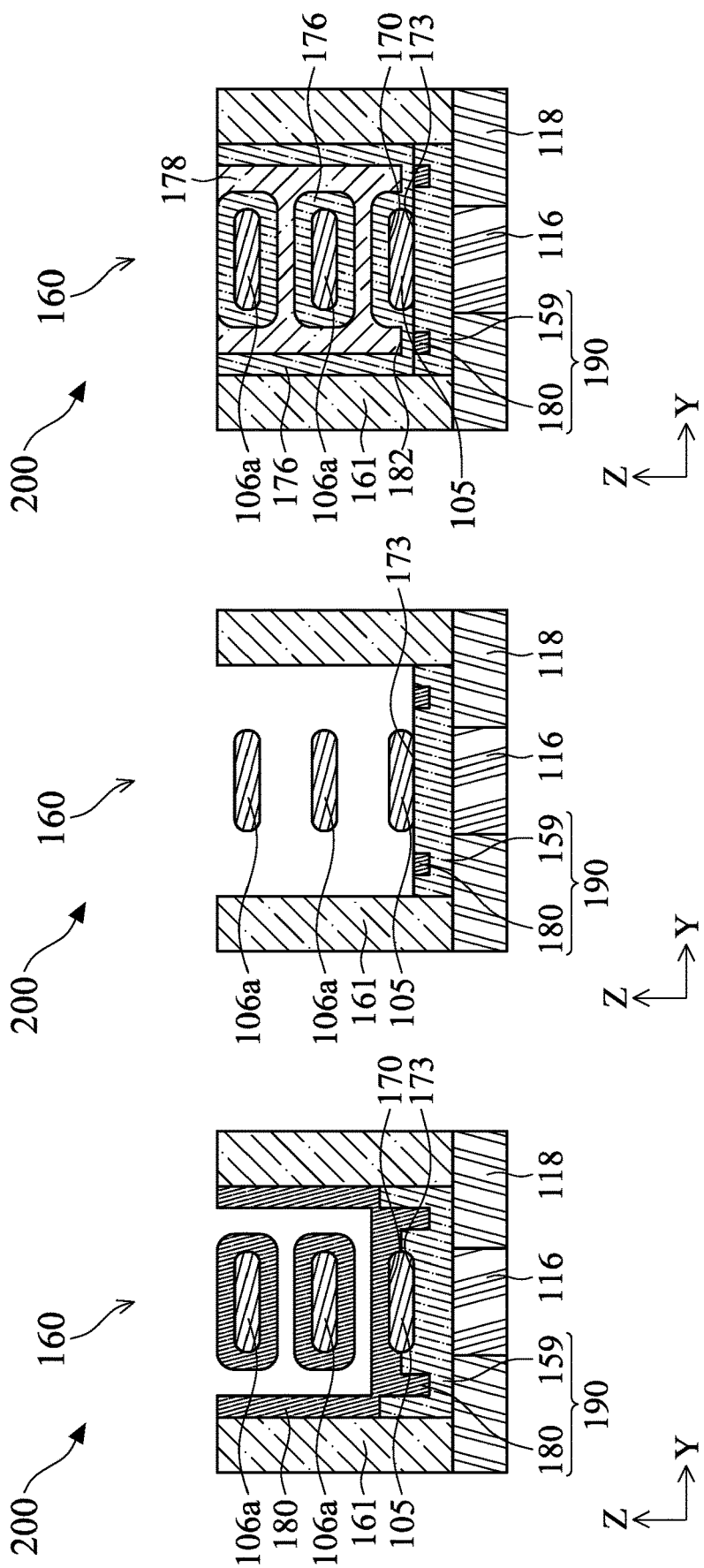

METHOD OF FORMING A SEMICONDUCTOR DEVICE STRUCTURE HAVING AN ISOLATION LAYER TO ISOLATE A CONDUCTIVE FEATURE AND A GATE ELECTRODE LAYER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-16A are cross-sectional side views of various stages of manufacturing the semiconductor device structure taken along line A-A of FIG. 8, in accordance with some embodiments.

FIGS. 9B-15B are cross-sectional side views of various stages of manufacturing the semiconductor device structure taken along line B-B of FIG. 8, in accordance with some embodiments.

FIG. 16B is a cross-sectional side view of a stage of manufacturing the semiconductor device structure taken along line C-C of FIG. 8, in accordance with some embodiments.

FIGS. 17A-17H are enlarged views of a region of FIG. 16B showing various stages of manufacturing the semiconductor device structure, in accordance with some embodiments.

FIGS. 18A-18C are enlarged views of the region of FIG. 16B showing various stages of manufacturing the semiconductor device structure, in accordance with alternative embodiments.

DETAILED DESCRIPTION

Figure 1:
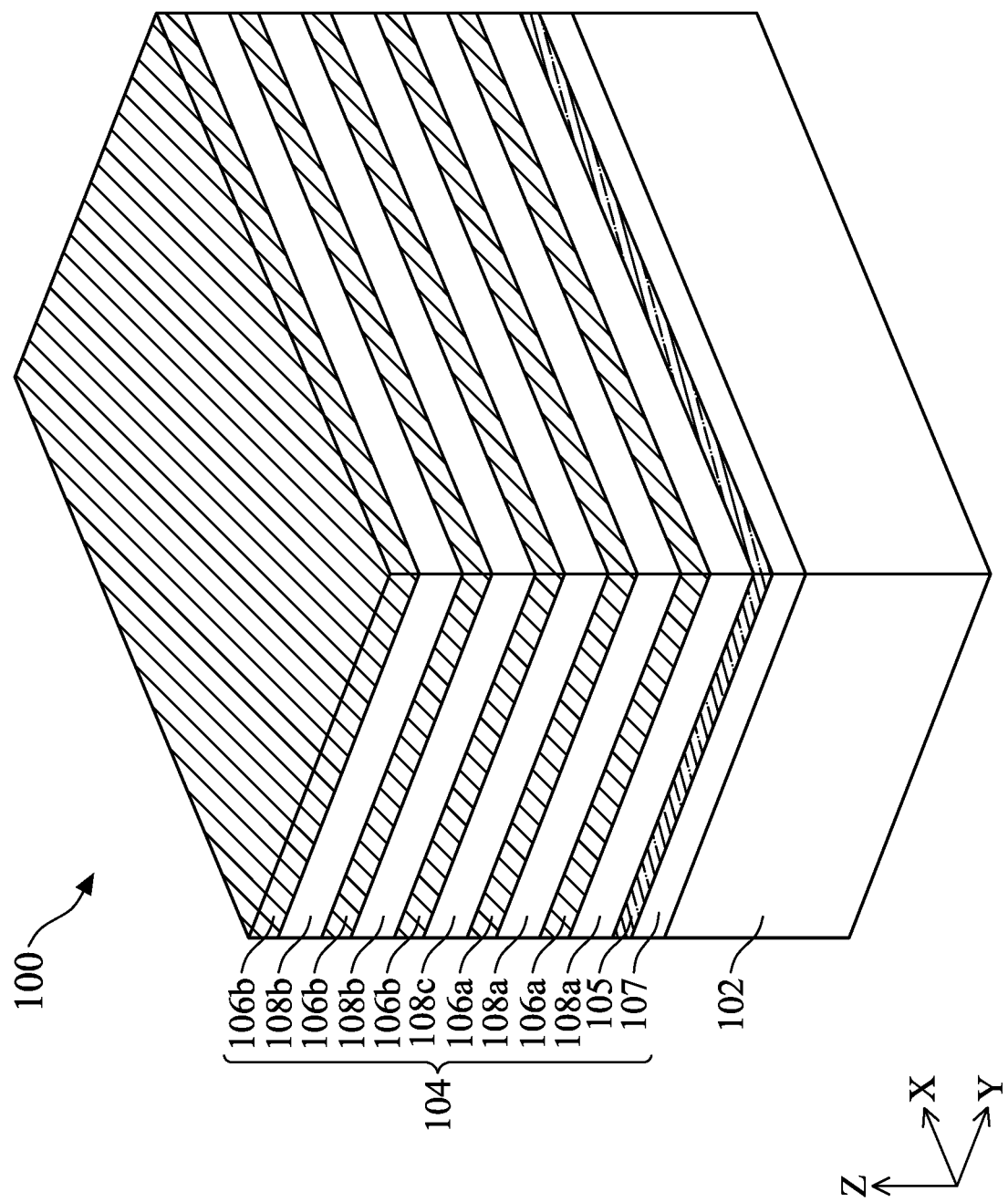
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-21 show exemplary sequential processes for manufacturing a semiconductor device structure 100, in accordance with some embodiments. It is understood that additional operations can be provided before, during, and after processes shown by FIGS. 1-21 and some of the operations described below can be replaced or eliminated, for additional embodiments of the method. The order of the operations/processes may be interchangeable.

FIGS. 1-8 are perspective views of various stages of manufacturing a semiconductor device structure, in accordance with some embodiments. As shown in FIG. 1, a stack of semiconductor layers 104 is formed over a substrate 102. The substrate 102 may be a semiconductor substrate. In some embodiments, the substrate 102 includes a single crystalline semiconductor layer on at least a surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 102 is made of Si. In some embodiments, the substrate 102 is a silicon-on-insulator (SOI) substrate, which includes an insulating layer (not shown) disposed between two silicon layers. In one aspect, the insulating layer is an oxide.

The stack of semiconductor layers 104 includes first semiconductor layers 106 (106a, 106b) and second semiconductor layers 108 (108a, 108b, 108c). The first semiconductor layers 106 and the second semiconductor layers 108 are made of semiconductor materials having different etch selectivity and/or oxidation rates. In some embodiments, either of the first and second semiconductor layers 106, 108 may be or include materials such as Si, Ge, SiC, GeAs, GaP, InP, InAs, InSb, GaAsP, AlInAs, AlGaAs, InGaAs, GaInP, GaInAsP, or other suitable material. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanosheet channel(s) of the semiconductor device structure 100 at a later stage. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below.

In some embodiments, the semiconductor device structure 100 includes a complementary field effect transistor (CFET), and the first semiconductor layers 106 includes channels for two or more nanosheet field effect transistors (FETs). For example, the first semiconductor layers 106a define the channels of a first FET, such as a p-type FET (PFET), and the first semiconductor layers 106b define the channels of a second FET, such as an n-type FET (NFET). The thickness of the first semiconductor layers 106a, 106b is chosen based on device performance considerations. In some embodiments, each first semiconductor layer 106a, 106b has a thickness ranging from about 4 nanometers (nm) to about 7 nm. The first semiconductor layer 106a may have the same or a different thickness as the first semiconductor layer 106b.

The second semiconductor layers 108a, 108b may eventually be removed and serve to define spaces for a gate stack to be formed therein. The thickness is chosen based on device performance considerations. In some embodiments, each second semiconductor layer 108a, 108b has a thickness ranging from about 8 nm to about 15 nm. The second semiconductor layer 108c may eventually be removed and serve to define a space for an isolation stack to be formed therein. The thickness of the second semiconductor layer 108c may be the same as, greater than, or less than that of the second semiconductor layers 108a, 108b.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

It is noted that 5 layers of the first semiconductor layers 106 and 5 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8. Furthermore, it is noted that the stack of semiconductor layers 104 includes 2 first semiconductor layers 106a and 3 first semiconductor layers 106b, which is for illustrative purposes and not intended to be limiting beyond what is specifically recited in the claims. It can be appreciated that any number of first semiconductor layers 106a and first semiconductor layers 106b can be formed in the stack of semiconductor layers 104; the number of layers depending on the predetermined number of channels for the first FET (e.g., the PFET) and for the second FET (e.g., the NFET). In some embodiments, the number of the first semiconductor layers 106a is the same as the number of the first semiconductor layers 106b. In other words, the PFET and the NFET of the CFET include the same number of channels. In some embodiments, as shown in FIG. 1, the number of the first semiconductor layers 106a is different from the number of the first semiconductor layers 106b. In other words, the PFET and the NFET of the CFET include different numbers of channels.

The stack of semiconductor layers 104 further includes a sacrificial semiconductor layer 107 disposed over the substrate 102 and a semiconductor layer 105 disposed on the sacrificial semiconductor layer 107. The alternating first and second semiconductor layers 106, 108 may be formed on the semiconductor layer 105, as shown in FIG. 1. The sacrificial semiconductor layer 107 is made of a semiconductor material having different etch selectivity than the first and second semiconductor layers 106, 108. In some embodiments, the second semiconductor layer 108 is made of SiGe having a first atomic percent germanium, and the sacrificial semiconductor layer 107 is made of SiGe having a second atomic percent germanium greater than the first atomic percent germanium. As a result, the sacrificial semiconductor layer 107 is etched at a faster rate than the second semiconductor layers 108 during an etch process. The sacrificial semiconductor layer 107 may eventually be removed and replaced with an isolation layer (or an isolation structure), which is further discussed below. The thickness of the sacrificial semiconductor layer 107 is less than the thickness of the second semiconductor layer 108. In some embodiments, the thickness of the sacrificial semiconductor layer 107 is less than the thickness of the second semiconductor layer 108 by 2 nm or more. For example, the thickness of the sacrificial semiconductor layer 107 may range from about 6 nm to about 13 nm.

The semiconductor layer 105 may have source or drain regions formed thereon in subsequent processes. The semiconductor layer 105 may be formed from epitaxially grown single crystalline semiconductor material(s) such as, but not limited to Si, Ge, germanium tin (GeSn), SiGe, GaAs, InSb, GaP, GaSb, InAlAs, InGaAs, GaSbP, GaAsSb, GaN, GaP, and InP. In some embodiments, the semiconductor layer 105 is made of the same material as the first semiconductor layers 106. The thickness of the semiconductor layer 105 may be less than the thickness of the first semiconductor layer 106. In some embodiments, the thickness of the semiconductor layer 105 is less than the thickness of the first semiconductor layer 106 by 2 nm to 4 nm. For example, the thickness of the sacrificial semiconductor layer 107 may range from about 1 nm to about 5 nm.

Figure 2:
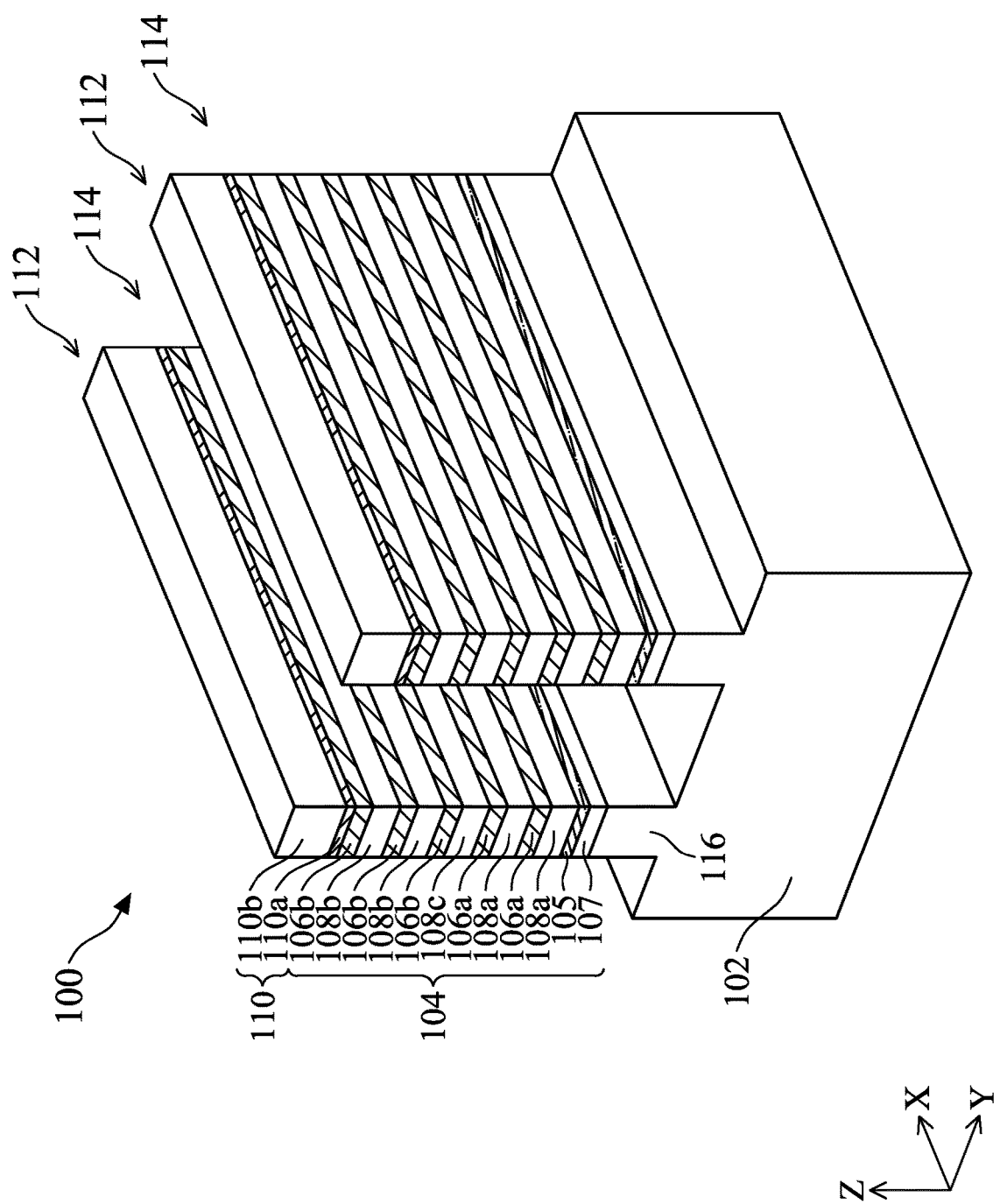

FIG. 2 is a perspective view of one of the various stages of manufacturing the semiconductor device structure 100, in accordance with some embodiments. As shown in FIG. 2, fins 112 are formed. In some embodiments, each fin 112 includes a substrate portion 116 formed from the substrate 102, a portion of the stack of semiconductor layers 104, and a portion of a mask structure 110. The mask structure 110 is formed over the stack of semiconductor layers 104 prior to forming the fins 112. The mask structure 110 may include an oxygen-containing layer 110a and a nitrogen-containing layer 110b. The oxygen-containing layer 110a may be a pad oxide layer, such as a $SiO_2$ layer. The nitrogen-containing layer 110b may be a pad nitride layer, such as $Si_3N_4$. The mask structure 110 may be formed by any suitable deposition process, such as chemical vapor deposition (CVD) process.

The fins 112 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 112 by etching the stack of semiconductor layers 104 and the substrate 102. The etch process can include dry etch, wet etch, reactive ion etch (RIE), and/or other suitable processes. As shown in FIG. 2, two fins 112 are formed, but the number of the fins is not limited to two.

In some embodiments, the fins 112 may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 102 and layers formed thereupon, while an etch process forms trenches 114 in unprotected regions through the mask structure 110, the stack of semiconductor layers 104, and into the substrate 102, thereby leaving the extending fins 112. The trenches 114 may be etched using a dry etch (e.g., RIE), a wet etch, and/or combination thereof.

Figure 3:
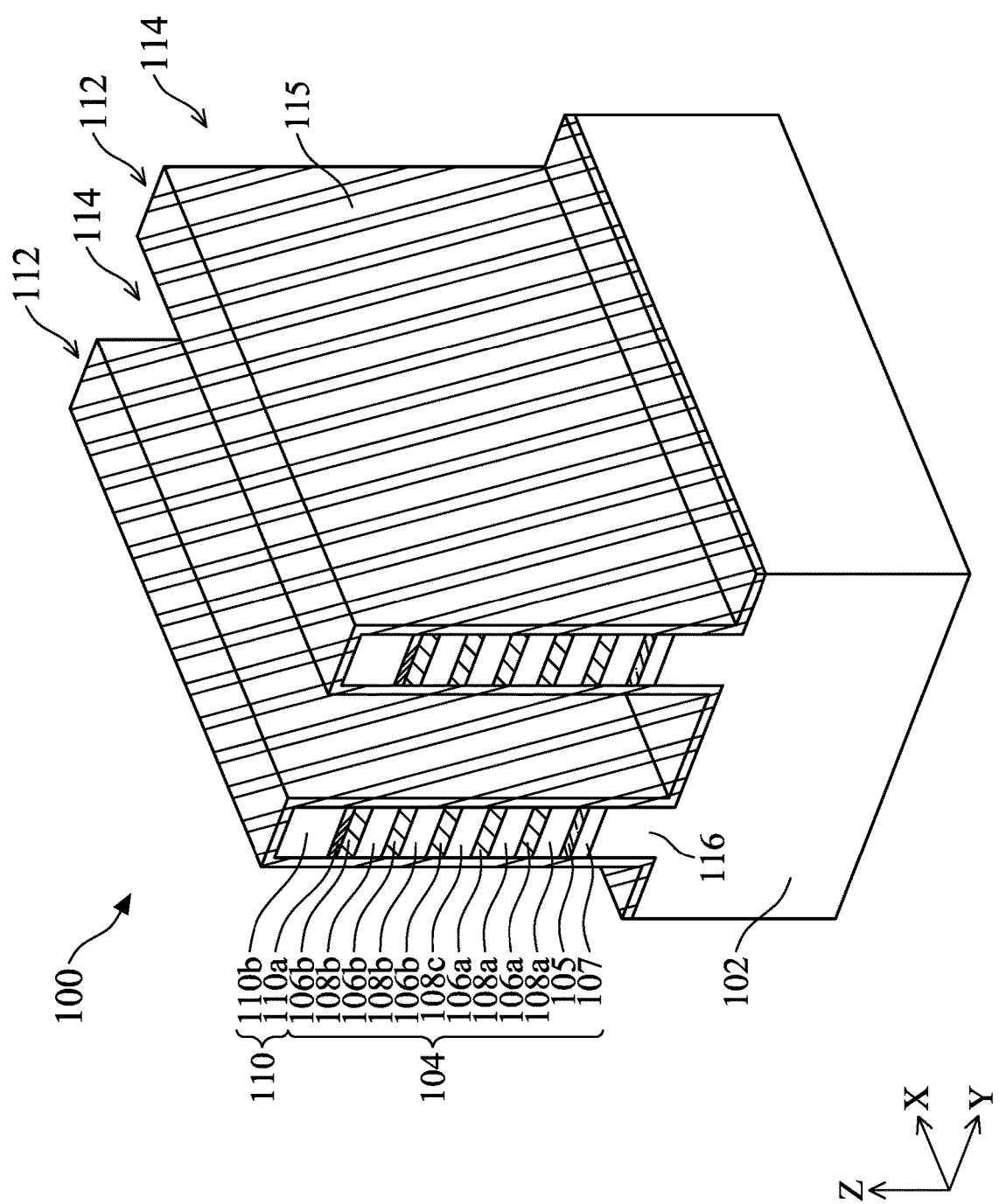

FIG. 3 is a perspective view of one of the various stages of manufacturing the semiconductor device structure 100, in accordance with some embodiments. As shown in FIG. 3, a liner 115 is formed over the substrate 102 and the fins 112. In some embodiments, an optional liner (not shown) may be formed on the substrate 102 and fins 112, and the liner 115 is formed on the optional liner. The liner 115 may be made of a semiconductor material, such as Si. In some embodiments, the liner 115 is made of the same material as the substrate 102. The liner 115 may be a conformal layer and may be formed by a conformal process, such as an atomic layer deposition (ALD) process. The term "conformal" may be used herein for ease of description upon a layer having substantial same thickness over various regions.

Figure 4:
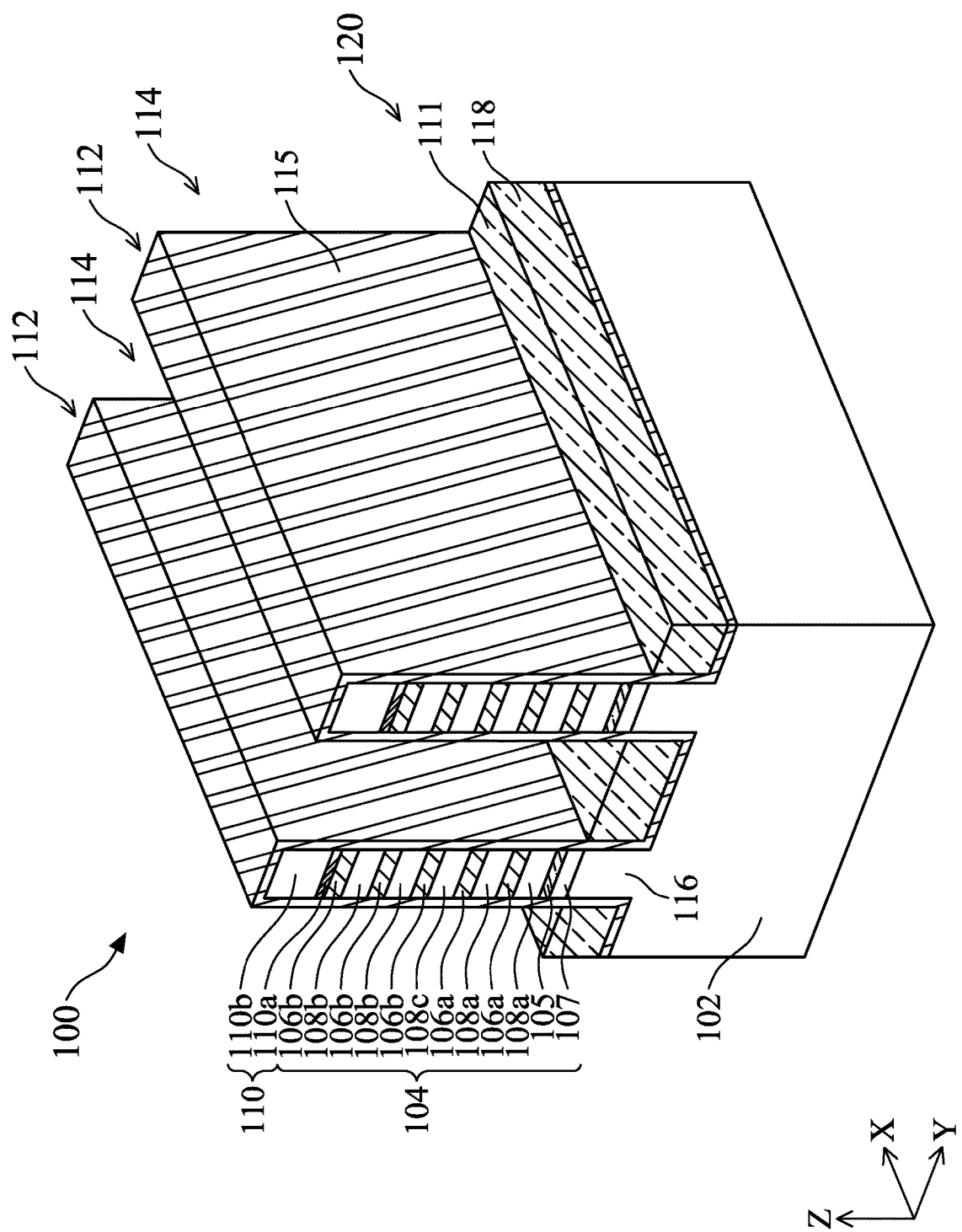

FIG. 4 is a perspective view of one of the various stages of manufacturing the semiconductor device structure 100, in accordance with some embodiments. As shown in FIG. 4, an insulating material 118 is formed on the substrate 102. The insulating material 118 may be made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material; or any suitable dielectric material. The insulating material 118 may be formed by first forming an insulating material over the substrate 102 so that the fins 112 are embedded in the insulating material. The insulating material may be formed by any suitable method, such as low-pressure chemical vapor deposition (LPCVD), plasma enhanced CVD (PECVD) or flowable CVD (FCVD). Then, a planarization operation, such as a chemical mechanical polishing (CMP) process and/or an etch-back process, is performed such that the tops of the fins 112 (e.g., the liner 115) are exposed from the insulating material. Next, the insulating material may be recessed by removing a portion of the insulating material located between adjacent fins 112 to form the insulating material 118. The insulating material 118 partially fills the trenches 114. The insulating material 118 may be the shallow trench isolation (STI) 120. The insulating material 118 includes a top surface 111 that may be level with or below a surface of the sacrificial semiconductor layer 107 in contact with the substrate portions 116 of the substrate 102.

Figure 5:
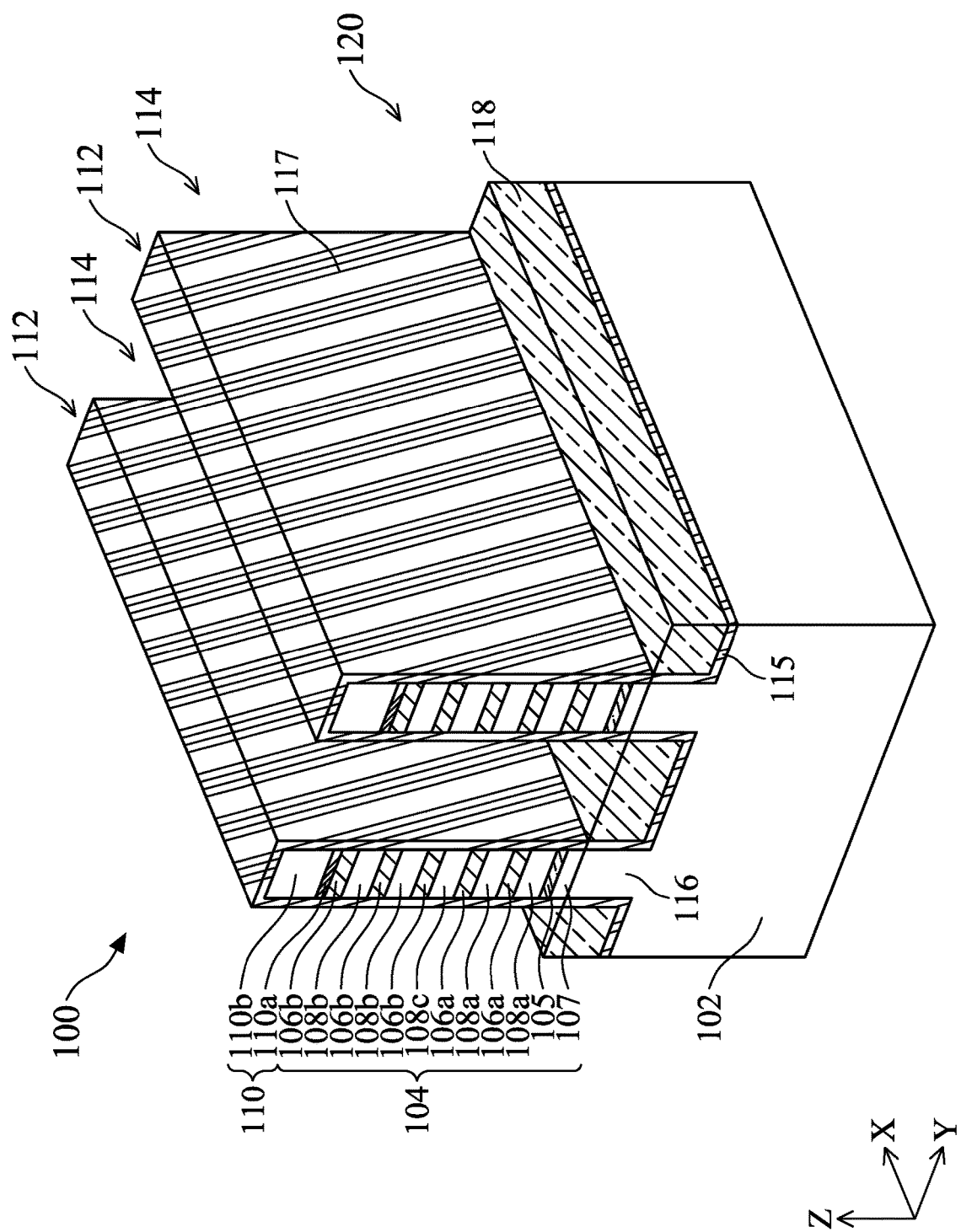

Next, as shown in FIG. 5, a cladding layer 117 is formed on the exposed surface of the liner 115. The liner 115 may be diffused into the cladding layer 117 during the formation of the cladding layer 117. Thus, in some embodiments where the optional liner does not exist, the cladding layer 117 is in contact with the stack of semiconductor layers 104, as shown in FIG. 5. In some embodiments, the cladding layer 117 includes a semiconductor material. The cladding layer 117 may grow on semiconductor materials but not on dielectric materials. For example, the cladding layer 117 includes SiGe and is grown on the Si of the liner 115 but not on the dielectric material of the insulating material 118. In some embodiments, the cladding layer 117 and the second semiconductor layers 108a, 108b, 108c include the same material having the same etch selectivity. For example, the cladding layer 117 and the second semiconductor layers 108a, 108b, 108c include SiGe. The cladding layer 117 and the second semiconductor layers 108a, 108b, 108c may be removed subsequently to create spaces for the gate stack and isolation stack.

Figure 6:
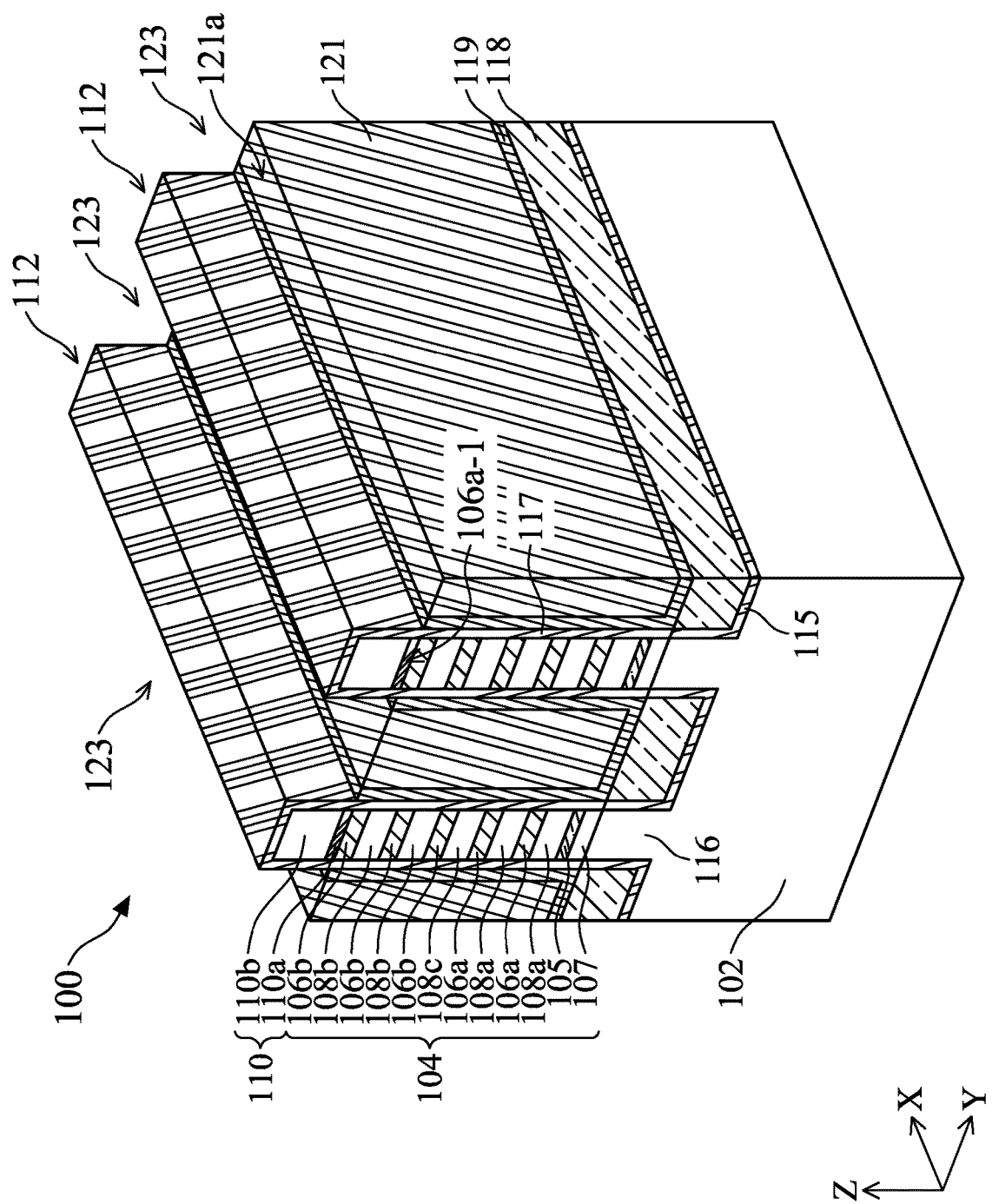

Next, as shown in FIG. 6, a liner 119 is formed on the cladding layer 117 and the insulating material 118. The liner 119 may include a low-k dielectric material (e.g., a material having a k value lower than 7), such as $SiO_2$, SiN, SiCN, SiOC, or SiOCN. The liner 119 may be formed by a conformal process, such as an ALD process. A dielectric material 121 is formed in the trenches 114 (FIG. 5) and on the liner 119, as shown in FIG. 6. The dielectric material 121 may be an oxygen-containing material, such as an oxide, and may be formed by FCVD. The oxygen-containing material may have a K value less than about 7, for example less than about 3. In some embodiments, the dielectric material 121 includes the same material as the insulating material 118. The liner 119 may have a thickness ranging from about 1 nm to about 6 nm. The liner 119 may function as a shell to protect the dielectric material 121 during subsequent removal of the cladding layer 117. Thus, if the thickness of the liner 119 is less than about 1 nm, the dielectric material 121 may not be sufficiently protected. On the other hand, if the thickness of the liner 119 is greater than about 6 nm, the trenches 114 (FIG. 5) may be filled.

The liner 119 and the dielectric material 121 may be first formed over the fins 112, followed by a planarization process, such as a CMP process, to remove portions of the liner 119 and the dielectric material 121 formed over the fins 112. The liner 119 and the dielectric material 121 may be further recessed to the level of the topmost first semiconductor layer 106a, as shown in FIG. 6. For example, in some embodiments, after the recess process, the dielectric material 121 may include a top surface 121a that is substantially level with a top surface 106a-1 of the topmost first semiconductor layer 106a. The top surface 106a-1 of the topmost first semiconductor layer 106a may be in contact with the mask structure 110, such as in contact with the oxygen-containing layer 110a. The liner 119 may be recessed to the same level as the dielectric material 121. The recess of the liners 119 and the dielectric materials 121 may be performed by any suitable process, such as dry etch, wet etch, or a combination thereof. In some embodiments, a first etch process may be performed to recess the dielectric material 121 followed by a second etch process to recess the liner 119. The etch processes may be selective etch processes that do not remove the semiconductor material of the cladding layer 117. As a result of the recess process, trenches 123 are formed between the fins 112.

Figure 7:
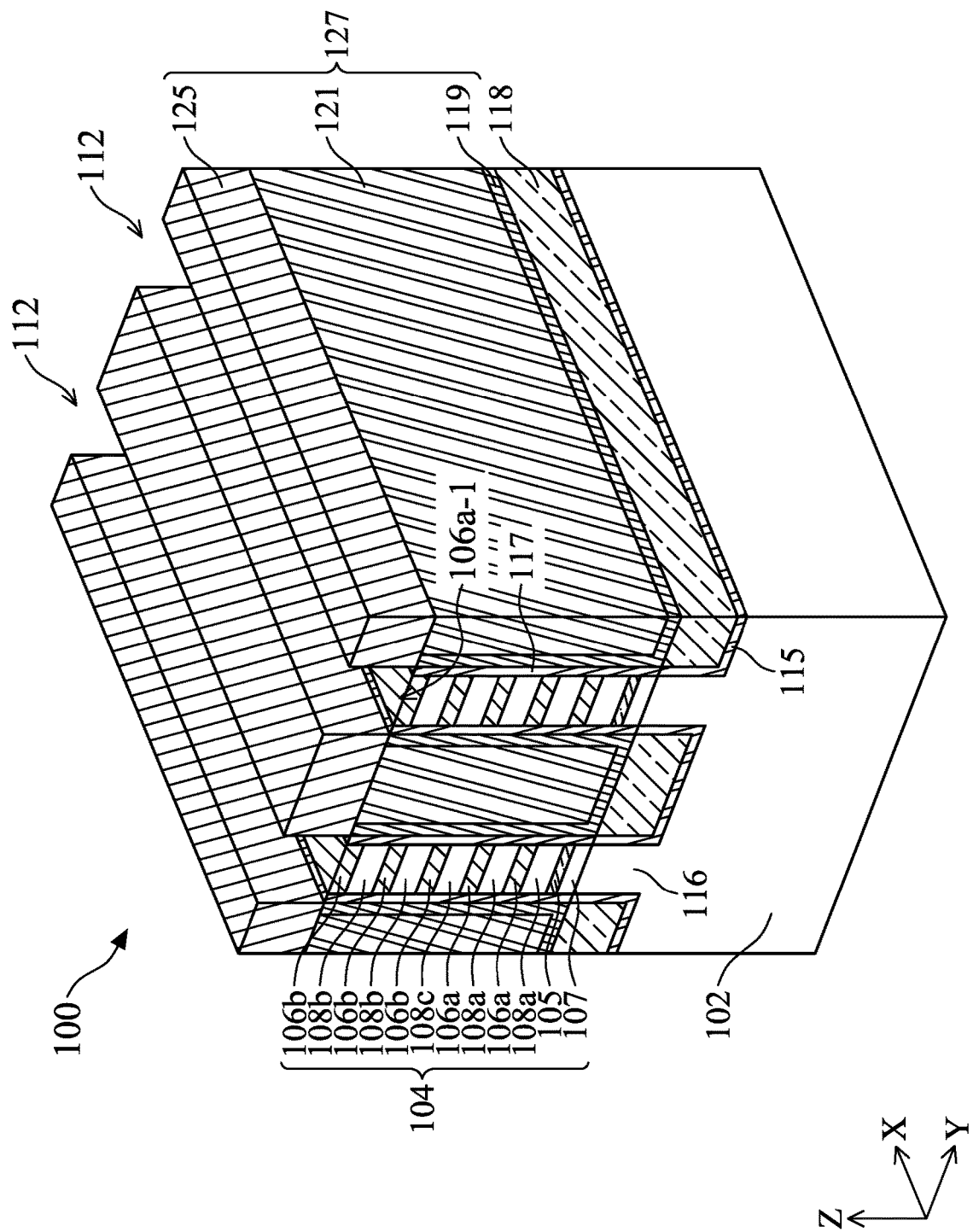

A dielectric material 125 is formed in the trenches 123 (FIG. 6) and on the dielectric material 121 and the liner 119, as shown in FIG. 7. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. The liner 119, the dielectric material 121, and the dielectric material 125 together may be referred to as a dielectric feature 127. The dielectric feature 127 may be a dielectric fin that separates adjacent source/drain (S/D) epitaxial features and adjacent gate electrode layers.

The cladding layers 117 are recessed, and the mask structures 110 are removed to expose the top surfaces 106a-1 of the topmost first semiconductor layers 106a, as shown in FIG. 7. The recess of the cladding layers 117 may be performed by any suitable process, such as dry etch, wet etch, or a combination thereof. The recess process may be controlled so that the remaining cladding layers 117 are substantially at the same level as the top surface 106a-1 of the topmost first semiconductor layer 106a in the stack of semiconductor layers 104. The etch process may be a selective etch process that does not remove the dielectric material 125. The removal of the mask structures 110 may be performed by any suitable process, such as dry etch, wet etch, or a combination thereof.

Figure 8:
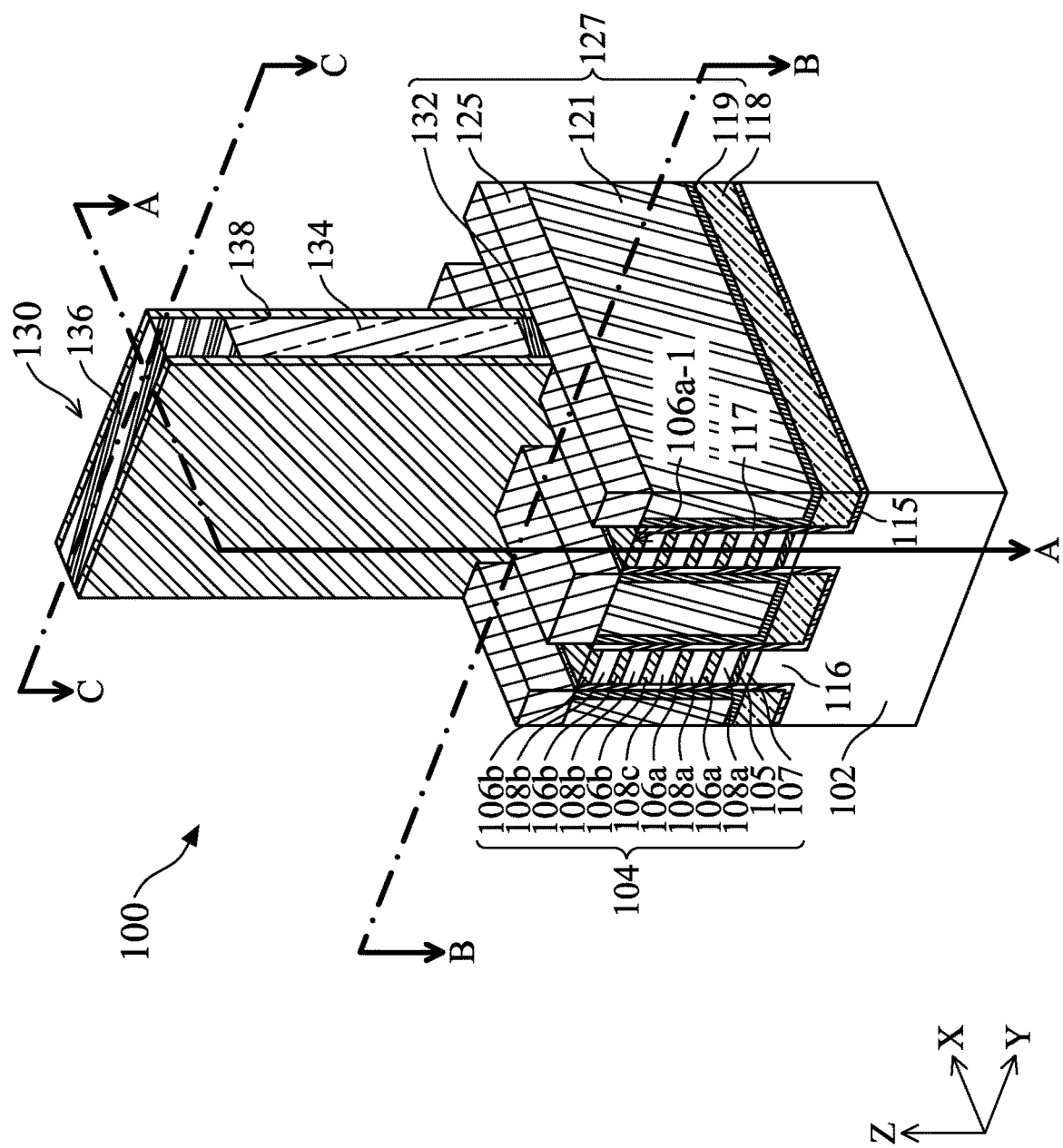

Next, as shown in FIG. 8, one or more sacrificial gate stacks 130 are formed on the semiconductor device structure 100. The sacrificial gate stack 130 may include a sacrificial gate dielectric layer 132, a sacrificial gate electrode layer 134, and a mask structure 136. The sacrificial gate dielectric layer 132 may include one or more layers of dielectric material, such as SiO$_2$, SiN, a high-k dielectric material, and/or other suitable dielectric material. In some embodiments, the sacrificial gate dielectric layer 132 includes a material different than that of the dielectric material 125. In some embodiments, the sacrificial gate dielectric layer 132 may be deposited by a CVD process, a sub-atmospheric CVD (SACVD) process, a FCVD process, an ALD process, a PVD process, or other suitable process. The sacrificial gate electrode layer 134 may include polycrystalline silicon (polysilicon). The mask structure 136 may include one or more layers of oxygen-containing layers and/or nitrogen-containing layers. In some embodiments, the sacrificial gate electrode layer 134 and the mask structure 136 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 130 may be formed by first depositing blanket layers of the sacrificial gate dielectric layer 132, the sacrificial gate electrode layer 134, and the mask structure 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 130, the stacks of semiconductor layers 104 of the fins 112 are partially exposed on opposite sides of the sacrificial gate stack 130. As shown in FIG. 8, one sacrificial gate stacks 130 are formed, but the number of the sacrificial gate stacks 130 is not limited to one. Two or more sacrificial gate stacks 130 are arranged along the X direction in some embodiments.

A spacer 138 is formed on the sidewalls of the sacrificial gate stacks 130. The spacer 138 may be formed by first depositing a conformal layer that is subsequently etched back to form spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 112, the cladding layer 117, the dielectric material 125, leaving the spacers 138 on the vertical surfaces, such as the sidewalls of sacrificial gate stack 130. The spacer 138 may be made of a dielectric material such as silicon oxide, silicon nitride, silicon carbide, silicon oxynitride, SiCN, silicon oxycarbide, SiOCN, and/or combinations thereof. In some embodiments, the spacer 138 includes multiple layers, such as main spacer walls, liner layers, and the like.

FIGS. 9A-15A are cross-sectional side views of various stages of manufacturing the semiconductor device structure 100 taken along line A-A of FIG. 8, in accordance with some embodiments. FIGS. 9B-14B are cross-sectional side views of various stages of manufacturing the semiconductor device structure taken along line B-B of FIG. 8, in accordance with some embodiments. FIGS. 9A and 9B show the stage of manufacturing the semiconductor device structure 100 shown in FIG. 8.

As shown in FIGS. 9A and 9B, exposed portions of the fins 112, exposed portions of the cladding layers 117, and exposed portions of the dielectric material 125 not covered by the sacrificial gate stacks 130 and the spacers 138 are selectively recessed or removed by using one or more suitable etch processes, such as dry etch, wet etch, or a combination thereof. In some embodiments, exposed portions of the stacks of semiconductor layers 104 of the fins 112 are recessed, exposing portions of the semiconductor layer 105. As shown in FIG. 9B, the exposed portions of the cladding layers 117 are removed. The recess/removal processes may include an etch process that recesses the exposed portions of the fins 112 and removes the exposed portions of the cladding layers 117.

Figures 14A, 14B:
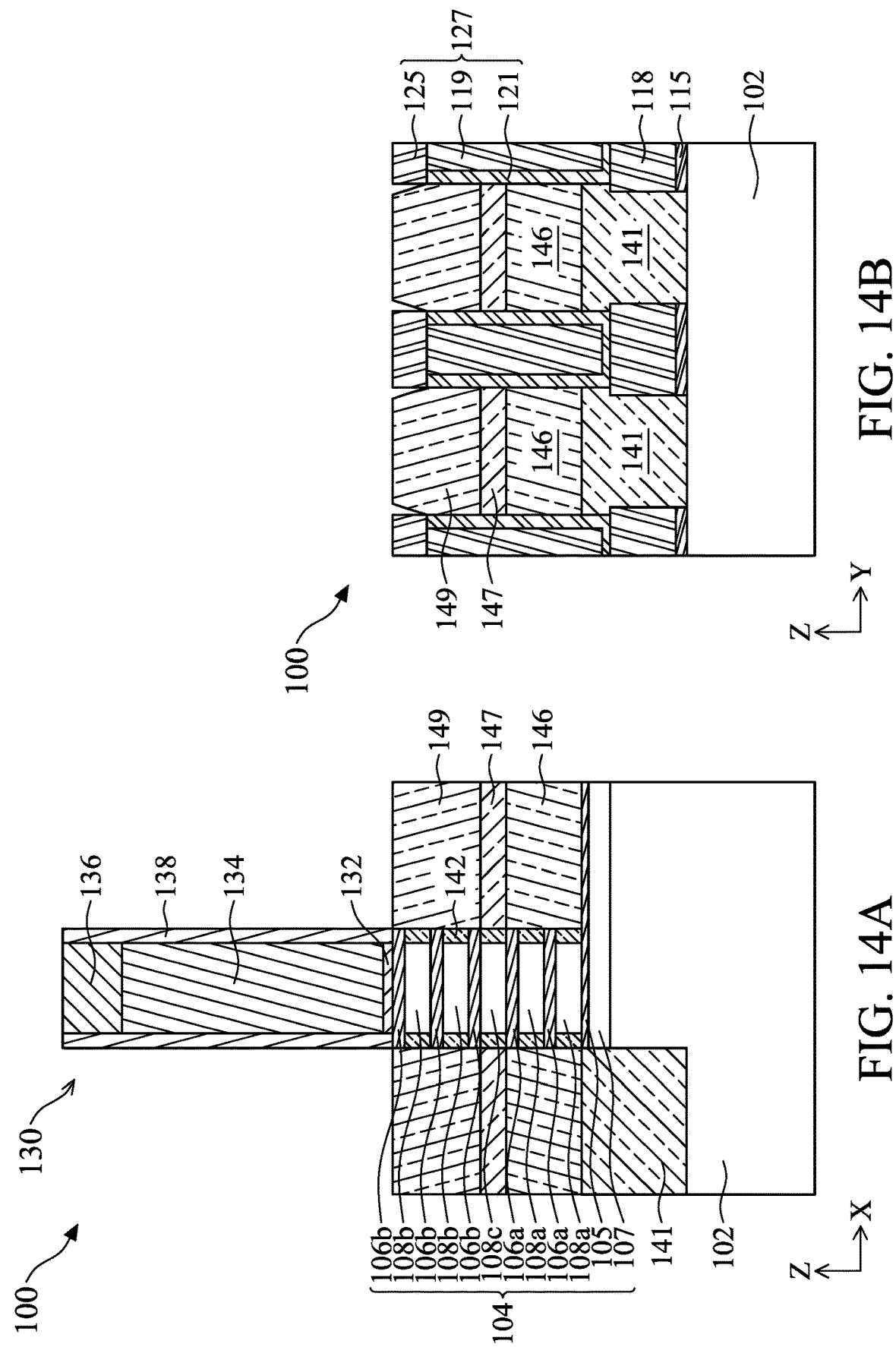

In some embodiments, the etch process may reduce the height of the exposed dielectric material 125 of the dielectric feature 127. Thus, a first portion of the dielectric material 125 under the sacrificial gate stack 130 and the spacers 138 has the height greater than a height of a second portion of the dielectric material 125 located between S/D epitaxial features 146, 149 (FIG. 14B).

As shown in FIG. 10A, a patterned mask layer 139 is disposed on portions of the semiconductor device structure 100. The patterned mask layer 139 may be a single layer or a multi-layer resist, such as a tri-layer resist layer including a bottom layer, a middle layer formed over the bottom layer, and a photoresist layer. As shown in FIG. 10A, the patterned mask layer 139 covers the exposed portion of the semiconductor layer 105 on one side of the sacrificial gate stack 130, while the exposed portion of the semiconductor layer 105 on the other side of the sacrificial gate stack 130 remains exposed. One or more etch processes may be performed to remove the exposed portion of the semiconductor layer 105, and the portion of the sacrificial semiconductor layer 107 and the portion of the substrate 102 disposed below the exposed portion of the semiconductor layer 105 may be also removed by the one or more etch processes, as shown in FIGS. 10A and 10B. The one or more etch processes may be the same as the one or more etch processes utilized to recess/remove the exposed portions of the fins 112 and the exposed portions of the cladding layers 117 as described in FIGS. 9A and 9B. The patterned mask layer 139 protects the portion of the semiconductor layer 105 and the materials disposed therebelow on one side of the sacrificial gate stack 130, and the exposed portion of the semiconductor layer 105 and the materials disposed therebelow on the other side of the sacrificial gate stack 130 are removed. As a result, a portion of the substrate 102 located on one side of the sacrificial gate stack 130 is exposed.

Next, as shown in FIGS. 11A and 11B, sacrificial layers 141 (or so-called backside contact alignment feature) are selectively formed on the exposed portions of the substrate 102. The sacrificial layers 141 may be formed to the level of the top surface of the semiconductor layer 105. The patterned mask layer 139 prevents the sacrificial layer 141 to be formed thereon because the sacrificial layer 141 forms on a semiconductor material, such as the substrate 102, but not on the material of the patterned mask layer 139. The sacrificial layer 141 is formed by CVD, CVD epitaxy, molecular beam epitaxy (MBE), or any suitable deposition technique. The sacrificial layer 141 will be removed and replaced with a backside contact at a later stage.

The material of the sacrificial layer 141 is chosen such that the sacrificial layer 141 has a different etch selectivity with respect to the substrate 102, the second semiconductor layers 108, the sacrificial semiconductor layer 107, and the insulating material 118. In some embodiments, the sacrificial layer 141 may be a silicon germanium (SiGe) layer having different germanium concentration as the SiGe of the sacrificial semiconductor layer 107. For example, the sacrificial layer 141 may have a germanium concentration less than that of the sacrificial semiconductor layer 107. After the sacrificial layers 141 are formed, the patterned mask layer 139 is removed using any suitable technique such as ashing, stripping, or the like.

Figure 12A:
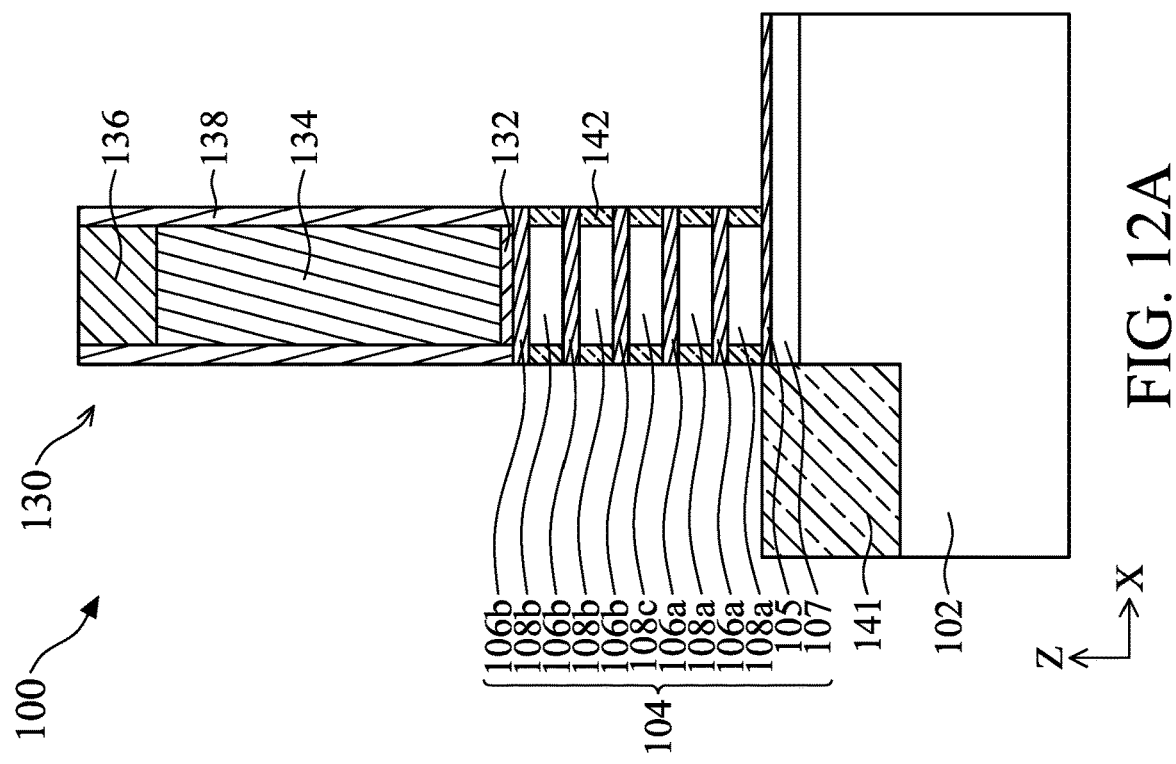
Figure 12B:
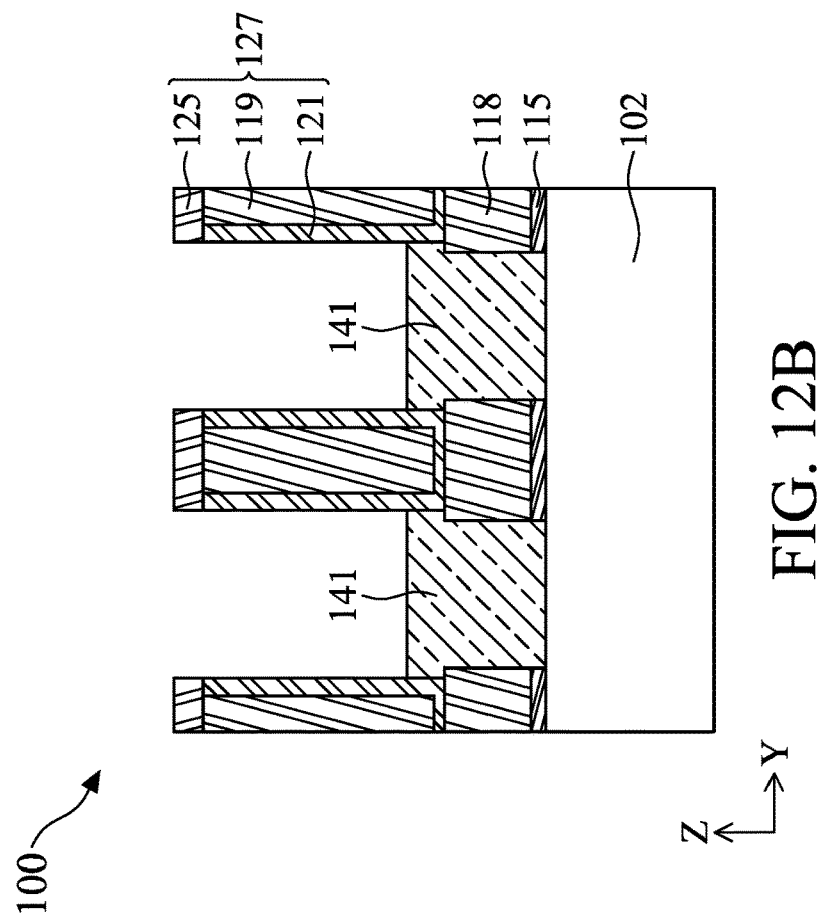

Next, as shown in FIG. 12A, edge portions of each second semiconductor layer 108a, 108b, 108c, and edge portions of the cladding layers 117 are removed. In some embodiments, the removal is a selective wet etch process. For example, in cases where the second semiconductor layers 108a, 108b, 108c are made of SiGe, the cladding layers 117 are made of the same material as the second semiconductor layers 108a, 108b, 108c, the first semiconductor layers 106a, 106b are made of silicon, and the sacrificial layers 141 are made of SiGe having lower germanium concentration than that of the second semiconductor layers 108a, 108b, 108c, a selective wet etch using an ammonia and hydrogen peroxide mixtures (APM) may be used. As a result, edge portions of the second semiconductor layers 108a, 108b, 108c and edge portions of the cladding layers 117 may be removed, and the first semiconductor layers 106a, 106b and the sacrificial layers 141 are substantially unchanged.

Next, dielectric spacers 142 are formed in the spaces created by the removal of the edge portions of the second semiconductor layers 108a, 108b, 108c and the edge portions of the cladding layers 117, as shown in FIG. 12A. In some embodiments, the dielectric spacers 142 may be flush with the spacers 138. The dielectric spacers 142 may include a low-k dielectric material, such as SiON, SiCN, SiOC, SiOCN, or SiN. In some embodiments, the dielectric spacers 142 may be formed by first forming a conformal dielectric layer using a conformal deposition process, such as ALD, followed by an anisotropic etching to remove portions of the conformal dielectric layer other than the dielectric spacers 142. The dielectric spacers 142 may be protected by the first semiconductor layers 106a, 106b during the anisotropic etching process.

Next, as shown in FIGS. 13A and 13B, S/D epitaxial features 146 are formed on the sacrificial layers 141 on one side of the sacrificial gate stack 130 and on the portions of the semiconductor layer 105 that is located on the other side of the sacrificial gate stack 130. The S/D epitaxial feature 146 may include one or more layers of Si, SiP, SiC and SiCP for an NFET or Si, SiGe, Ge for a PFET. In some embodiments, the S/D epitaxial feature 146 includes one or more layers of Si, SiGe, and Ge for a PFET. The S/D epitaxial features 146 may grow both vertically and horizontally to form facets, which may correspond to crystalline planes of the material used for the substrate 102 and the semiconductor layer 105. The S/D epitaxial features 146 may be formed by an epitaxial growth method using CVD, ALD or MBE. The S/D epitaxial features 146 are in contact with the first semiconductor layers 106a and the dielectric spacers 142, as shown in FIG. 13A. The S/D epitaxial features 146 may be the S/D regions. In this disclosure, a source region and a drain region are interchangeably used, and the structures thereof are substantially the same. In some embodiments, the S/D epitaxial features 146 formed on the corresponding sacrificial layers 141 are source epitaxial features, and the S/D epitaxial features 146 formed on the portions of the semiconductor layer 105 are drain epitaxial features. In some embodiments, the S/D epitaxial features 146 are formed on a top surface 170 of the semiconductor layer 105. The sacrificial layers 141 may be replaced with backside contacts which are in contact with one or more power rails disposed therebelow in order to provide electrical currents to the S/D epitaxial features 146 formed on the sacrificial layers 141.

The S/D epitaxial features 146 may be formed by first forming an epitaxial material filling the space between adjacent dielectric features 127, followed by recessing the epitaxial materials to form the S/D epitaxial features 146. The recess of the epitaxial materials may be performed by any suitable process, such as dry etch or wet etch that selectively removes a portion of each epitaxial material but not the dielectric materials of the mask structure 136, the dielectric spacer 142, and the dielectric material 125.

As shown in FIG. 13A, the S/D epitaxial features 146 are in contact with the first semiconductor layers 106a. In some embodiments, the semiconductor device structure 100 includes a nanosheet PFET having a source epitaxial feature 146 and a drain epitaxial feature 146 and both are in contact with one or more first semiconductor layers 106a, or one or more channels.

Next, as shown in FIGS. 14A and 14B, an isolation layer 147 is formed on each S/D epitaxial feature 146. The isolation layer 147 may include the same material as the insulating material 118. In some embodiments, the isolation layer 147 includes an oxide that is formed by FCVD. The isolation layer 147 may be formed by first filling the space between adjacent dielectric features 127 with an isolation material using FCVD, followed by recessing the isolation material to a level below the level of the bottommost first semiconductor layers 106b. The recess of the isolation material may be performed by any suitable process, such as dry etch or wet etch that selectively removes a portion of the isolation material but not dielectric materials of the mask structure 136, the spacer 138, and the dielectric material 125.

Next, as shown in FIGS. 14A and 14B, S/D epitaxial features 149 are formed on the isolation layers 147. The isolation layer 147 may electrically isolate the S/D epitaxial feature 146 and the S/D epitaxial feature 149. The S/D epitaxial feature 149 may include one or more layers of Si, SiP, SiC and SiCP for an NFET or Si, SiGe, Ge for a PFET. In some embodiments, the S/D epitaxial feature 149 includes one or more layers of Si, SiP, SiC and SiCP for an NFET. The S/D epitaxial features 149 may be formed from the first semiconductor layers 106b. The S/D epitaxial features 149 may grow both vertically and horizontally to form facets, which may correspond to crystalline planes of the material used for the first semiconductor layers 106b. The S/D epitaxial features 149 may be formed by an epitaxial growth method using CVD, ALD or MBE. The S/D epitaxial features 149 may be the S/D regions.

As shown in FIG. 14A, the S/D epitaxial features 149 are in contact with the first semiconductor layers 106b. In some embodiments, the semiconductor device structure 100 includes a nanosheet NFET having a source epitaxial feature 149 and a drain epitaxial feature 149 and both are in contact with one or more first semiconductor layers 106b, or one or more channels. The S/D epitaxial features 149 may be disposed over and aligned with corresponding S/D epitaxial features 146, as shown in FIGS. 14A and 14B, and the semiconductor device structure 100 may include a CFET having an NFET disposed over and aligned with a PFET.

Next, as shown in FIGS. 15A and 15B, a contact etch stop layer (CESL) 162 may be formed on the S/D epitaxial features 149, the dielectric features 127, and adjacent the spacers 138. The CESL 162 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 162 may be formed by CVD, PECVD, ALD, or any suitable deposition technique. In some embodiments, the CESL 162 is a conformal layer formed by the ALD process. An interlayer dielectric (ILD) layer 164 may be formed on the CESL 162. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

A planarization process is performed to expose the sacrificial gate electrode layer 134, as shown in FIGS. 15A and 15B. The planarization process may be any suitable process, such as a CMP process. The planarization process removes portions of the ILD layer 164 and the CESL 162 disposed on the sacrificial gate stacks 130. The planarization process may also remove the mask structure 136.

FIG. 16B is a cross-sectional side view of a stage of manufacturing the semiconductor device structure 100 taken along line C-C of FIG. 8, in accordance with some embodiments. As shown in FIGS. 16A and 16B, the sacrificial gate electrode layer 134 and the sacrificial gate dielectric layer 132 are removed, exposing the cladding layers 117 (FIG. 7) and the stacks of semiconductor layers 104. The sacrificial gate electrode layer 134 may be first removed by any suitable process, such as dry etch, wet etch, or a combination thereof, followed by the removal of the sacrificial gate dielectric layer 132, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the spacers 138, the ILD layer 164, the dielectric material 125 of the dielectric features 127, and the CESL 162.

As shown in FIGS. 16A and 16B, the cladding layers 117, the sacrificial semiconductor layer 107, and the second semiconductor layers 108 are removed. The removal processes expose the dielectric spacers 142, the substrate portion 116, and the first semiconductor layers 106. The removal process may be any suitable processes, such as dry etch, wet etch, or a combination thereof. The etch process may be a selective etch process that removes the cladding layers 117, the sacrificial semiconductor layer 107, and the second semiconductor layers 108 but not the spacers 138, the CESL 162, the dielectric material 125, and the first semiconductor layers 106. As a result, openings 160 are formed, as shown in FIGS. 16A and 16B. The portion of each first semiconductor layer 106 not covered by the dielectric spacers 142 may be exposed in the openings 160. Each first semiconductor layer 106a may be a nanosheet channel of a first nanosheet transistor, and each first semiconductor layer 106b may be a nanosheet channel of a second nanosheet transistor disposed over and aligned with the first nanosheet transistor.

Figure 17H:
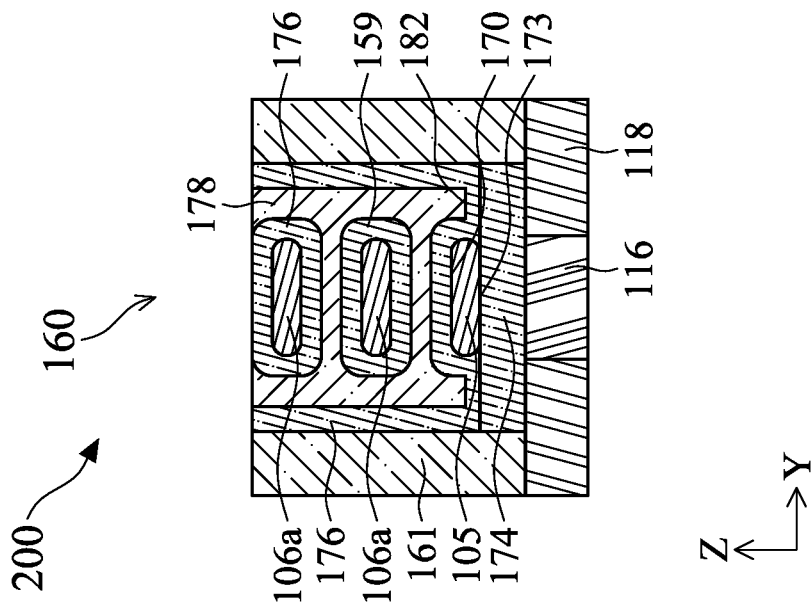

FIGS. 17A-17H are enlarged views of a region 200 of FIG. 16B showing various stages of manufacturing the semiconductor device structure, in accordance with some embodiments. The liner 115 may be omitted for clarity. As shown in FIG. 17A, in some embodiments, the dielectric features 127 (FIG. 16B) are replaced with dielectric features 161. The dielectric feature 161 may include any suitable dielectric material. In some embodiments, the dielectric feature 161 includes a dielectric material similar to the dielectric material 121. A first dielectric layer 159 may be formed on the substrate portion 116, on the insulating material 118, on the dielectric features 161 (or the dielectric features 127 shown in FIG. 16B), around the semiconductor layer 105, and around the first semiconductor layers 106. In some embodiments, each of the first semiconductor layers 106 may be surrounded by a native oxide layer (not shown), and the first dielectric layer 159 surrounds each of the native oxide layers that surrounds the corresponding first semiconductor layer 106. The first dielectric layer 159 may be an oxygen-containing layer, such as an oxide layer. In some embodiments, the first dielectric layer 159 includes $TiO_2$, $AlO_x$, $HfO_x$, or $ZrO_x$. For example, the first dielectric layer 159 is made of $TiO_2$, $Al_2O_3$, $HfO_2$, or $ZrO_2$. The first dielectric layer 159 may be a conformal layer formed by a conformal process, such as ALD. The first dielectric layer 159 may have a thickness ranging from about 3 nm to about 6 nm. The thickness of the first dielectric layer 159 is defined so the space between the semiconductor layer 105 and the substrate portion 116 is filled with the first dielectric layer 159, while a gap is formed between the portion of the first dielectric layer 159 surrounding the first semiconductor layer 106a and the portion of the first dielectric layer 159 surrounding the adjacent first semiconductor layer 106a. The space between the semiconductor layer 105 and the substrate portion 116 is defined by the thickness of the sacrificial semiconductor layer 107 (FIG. 15A), and the space between adjacent first semiconductor layers 106a is defined by the thickness of the second semiconductor layer 108a (FIG. 15A), which is greater than the thickness of the sacrificial semiconductor layer 107.

The first dielectric layer 159 may include a first portion disposed on the dielectric feature 161 (or the dielectric feature 127 shown in FIG. 16B) and a second portion surrounding the first semiconductor layers 106. As shown in FIG. 17A, a distance D1 is between the first portion and the second portion of the first dielectric layer 159, and a distance D2 is between adjacent second portions of the first dielectric layer 159. In some embodiments, the distance D1 is greater than the distance D2.

Next, as shown in FIG. 17B, an optional liner 166 is formed on the first dielectric layer 159. The optional liner 166 may fill the space between adjacent second portions of the first dielectric layer 159, and a gap may be formed between the portion of the optional liner 166 formed on the first portion of the first dielectric layer 159 and the portion of the optional liner 166 formed on the second portion of the first dielectric layer 159. In other words, the space defined by the distance D2 is filled with the optional liner 166 while the space defined by the distance D1 is partially filled with the optional liner 166. A mask material 168 is formed in the gap between the portion of the optional liner 166 formed on the first portion of the first dielectric layer 159 and the portion of the optional liner 166 formed on the second portion of the first dielectric layer 159, as shown in FIG. 17B. In other words, the space defined by the distance D1 is filled with the optional liner 166 and the mask material 168. The mask material 168 may be a bottom antireflective coating (BARC) material, which may be a spin-on organic material or a spin-on carbon material.

In some embodiments, the mask material 168 is a material that cannot fill a gap smaller than about 3 nm, such as smaller than about 2 nm, and the optional liner 166 may be omitted. In such embodiments, because the distance D1 is greater than the distance D2, the space defined by the distance D1 is filled with the mask material 168, and the space defined by the distance D2 is not filled with a material. Thus, if the mask material 168 is capable of filling a gap smaller than about 3 nm, the optional liner 166 may be utilized to prevent the mask material 168 from forming between adjacent second portions of the first dielectric layer 159. If the mask material 168 is not capable of filling a gap smaller than about 3 nm, the optional liner 166 may be omitted.

Next, as shown in FIG. 17C, the mask material 168 may be recessed to the same level as the top surface 170 of the semiconductor layer 105. The top surface 170 may face the first semiconductor layer 106a. The recess of the mask material 168 exposes portions of the optional liner 166 (or the first dielectric layer 159 if the optional liner 166 is omitted) disposed above the level of the top surface 170 of the semiconductor layer 105. The recess of the mask material 168 may be any suitable process, such as a dry etch, a wet etch, or a combination thereof. The recess process may be a selective etch that removes portions of the mask material 168 but not the optional liner 166 (or the first dielectric layer 159 if the optional liner 166 is omitted).

Next, as shown in FIG. 17D, the remaining mask material 168, the optional liner 166, and portions of the first dielectric layer 159 disposed above the level of the top surface 170 of the semiconductor layer 105 are removed, and the remaining first dielectric layer 159 is disposed below the level of the top surface 170. Openings 171 may be formed as the result of the removal processes. In the embodiments without the optional liner 166, the portions of the first dielectric layer 159 are removed first, followed by the removal of the remaining mask material 168. The portions of the first dielectric layer 159 may be removed by any suitable process, such as a dry etch, a wet etch, or a combination thereof. The removal process may be a selective etch process that removes portions of the first dielectric layer 159 but not the remaining mask material 168 and the portion of the first dielectric layer 159 disposed below the top surface 170 (i.e., the top surface 170 is exposed after the removal process). The remaining mask material 168 may be removed by a selective etch process that removes the remaining mask material 168 but not the remaining portion of the first dielectric layer 159, as shown in FIG. 17D.

In the embodiments with the optional liner 166, the portions of the optional liner 166 and the portions of the first dielectric layer 159 disposed above the level of the top surface 170 may be removed first, followed by the removal of the remaining mask material 168, and then the removal of the remaining portion of the optional liner 166 disposed below the top surface 170 (i.e., the top surface 170 is exposed after the removal process). The portions of the first dielectric layer 159 and the portions of the optional liner 166 may be removed in any order and by any suitable process, such as a dry etch, a wet etch, or a combination thereof. The removal process may be one or more selective etch processes that remove portions of the first dielectric layer 159 and portions of the optional liner 166 but not the remaining mask material 168 and the portion of the first dielectric layer 159 disposed below the top surface 170. The remaining mask material 168 may be removed by a selective etch process that removes the remaining mask material 168 but not the remaining portion of the first dielectric layer 159 and the remaining portion of the optional liner 166. The remaining portion of the optional liner 166 may be removed by a selective etch process that removes remaining portion of the optional liner 166 but not the remaining portion of the first dielectric layer 159, as shown in FIG. 17D.

A second dielectric layer 172 is formed in the openings 171, on portions of the dielectric features 161 (or the dielectric features 127 shown in FIG. 16B), on the semiconductor layer 105, and around the first semiconductor layers 106, as shown in FIG. 17E. The second dielectric layer 172 may include the same material as the first dielectric layer 159 and maybe formed by the same method as the first dielectric layer 159. As a result, the first and second dielectric layers 159, 172 fill the space between the level of a bottom surface 173 of the semiconductor layer 105 and the level of the substrate portion 116/insulating material 118. The bottom surface 173 may be opposite of the top surface 170. The first and second dielectric layers 159, 172 disposed in the space between the level of the bottom surface 173 of the semiconductor layer 105 and the level of the substrate portion 116/insulating material 118 may be referred to as an isolation layer 174.

Figure 21:
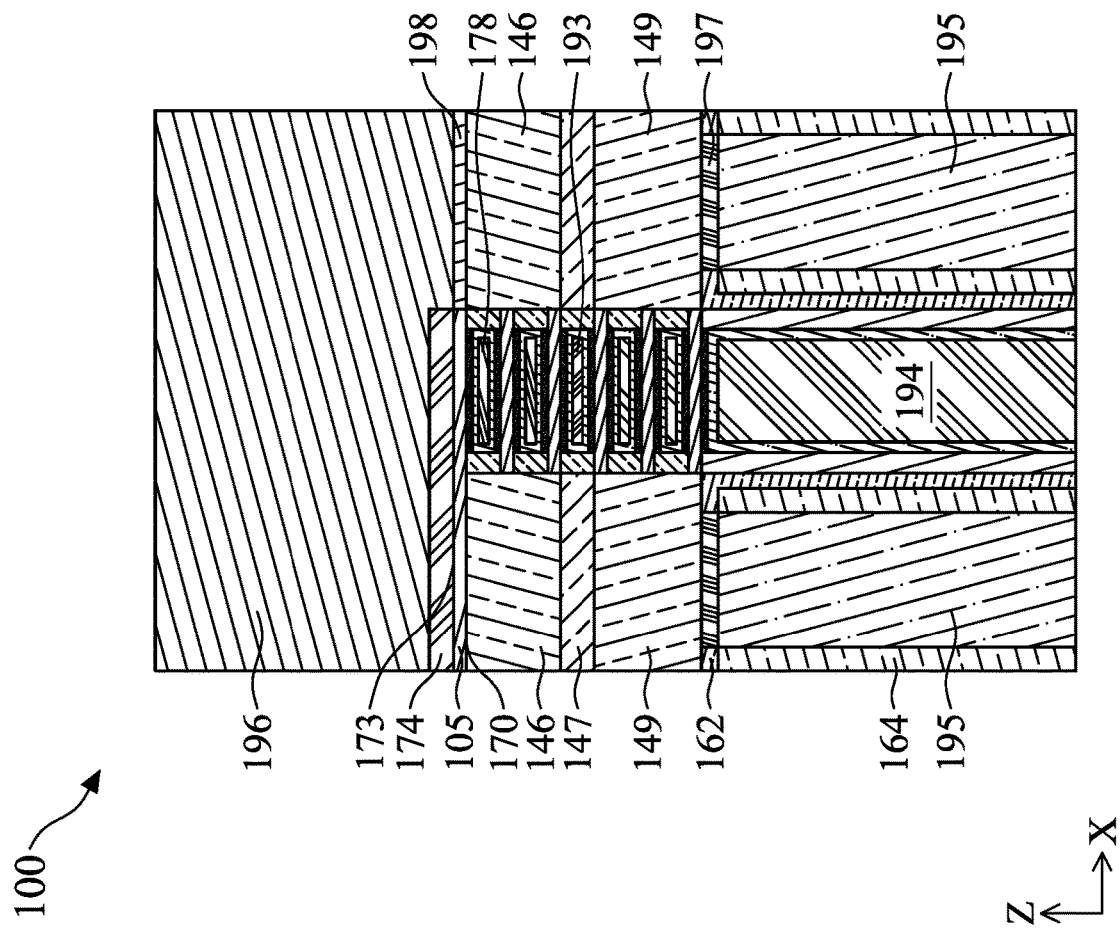
FIG. 21 is a cross-sectional side view of a stage of manufacturing the semiconductor device structure, in accordance with some embodiments.

Next, as shown in FIG. 17F, portions of the second dielectric layer 172 disposed above the level of the bottom surface 173 of the semiconductor layer 105 are removed. The portions of the second dielectric layer 172 may be removed by the same method as the removal of the portions of the first dielectric layer 159 described in FIG. 17D. The removal process may be performed based on the thickness of the second dielectric layer 172. For example, if the second dielectric layer 172 has a thickness of about 3 nm, an isotropic etch process may be controlled to remove at least or about 3 nm of the second dielectric layer 172. In some embodiments, a moderate wet etch process may be performed to remove the portions of the second dielectric layer 172 disposed above the level of the bottom surface 173 of the semiconductor layer 105. The moderate wet etch process does not remove the portions of the second dielectric layer 172 disposed below the level of the bottom surface 173 of the semiconductor layer 105. Since the amount of the second dielectric layer 172 to be etched is controlled, mainly portions of the second dielectric layer 172 above the level of the bottom surface 173 of the semiconductor layer 105 are removed. As a result, as shown in FIG. 17F, the isolation layer 174 is disposed in the space between the level of the bottom surface 173 of the semiconductor layer 105 and the level of the substrate portion 116/insulating material 118. The isolation layer 174 may have a thickness ranging from about 6 nm to about 13 nm. The thickness of the isolation layer 174 is defined by the thickness of the sacrificial semiconductor layer 107. The isolation layer 174 isolates a first gate electrode layer 178 (FIG. 17H) and a conductive feature 196 (FIG. 21). Furthermore, the isolation layer 174 isolates the conductive feature 196 (FIG. 21) and the S/D epitaxial feature 146 (FIG. 21). Thus, if the thickness of the isolation layer 174 is less than about 6 nm, the isolation layer 174 may not be sufficient to isolate the materials. On the other hand, if the thickness of the isolation layer 174 is greater than about 13 nm, the manufacturing cost is increased without significant advantage.

Figure 17G:
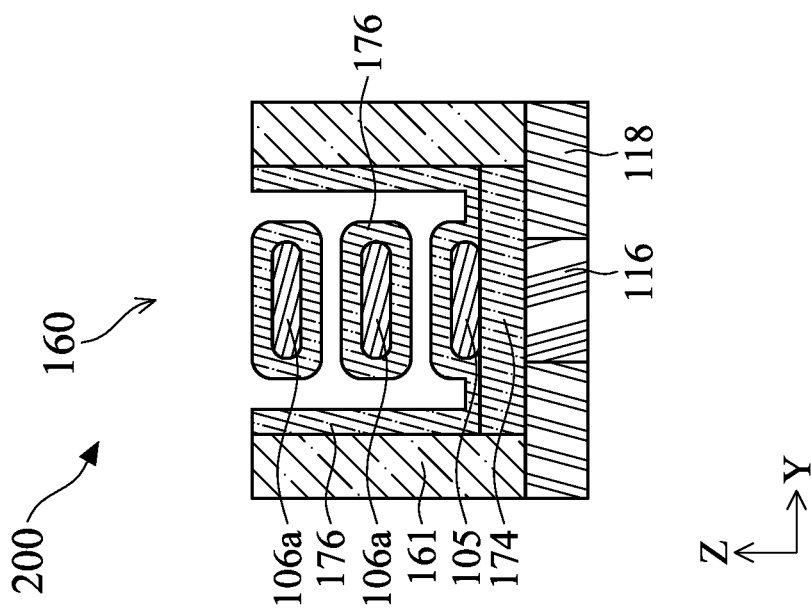

Next, as shown in FIG. 17G, a gate dielectric layer 176 is formed on the isolation layer 174 and around the semiconductor layer 105 and the first semiconductor layers 106. The gate dielectric layer 176 may include the same material as the sacrificial gate dielectric layer 132 (FIG. 8). In some embodiments, the gate dielectric layer 176 includes a high-k dielectric material. In some embodiments, an oxygen-containing layer 192 (FIG. 20) may be formed around the semiconductor layer 105 and the first semiconductor layers 106, and the gate dielectric layer 176 is formed on the oxygen-containing layer 192. The oxygen-containing layer 192 and the gate dielectric layer 176 may be formed by any suitable processes, such as ALD processes. In some embodiments, the oxygen-containing layer 192 and the gate dielectric layer 176 are formed by conformal processes.

Next, as shown in FIG. 17H, the first gate electrode layer 178 is formed in each opening 160 (FIG. 17G) and on the gate dielectric layer 176. The first gate electrode layer 178 is formed on the gate dielectric layer 176 to surround a portion of each first semiconductor layer 106a. The first gate electrode layer 178 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The first gate electrode layer 178 may be formed by PVD, CVD, ALD, electro-plating, or other suitable method. In some embodiments, the first gate electrode layer 178 includes a p-type gate electrode layer such as TiN, TaN, TiTaN, TiAlN, WCN, W, Ni, Co, or other suitable material, and the first gate electrode layer 178 is a gate electrode layer of a PFET. The first gate electrode layer 178 may be formed by first forming a gate electrode layer filling the opening 160, followed by an etch back process to recess the gate electrode layer to a level at or just below the top surface of the topmost first semiconductor layer 106a (FIG. 16B).

The first gate electrode layer 178 includes an end 182 that does not extend below a plane defined by the bottom surface 173 of the semiconductor layer 105, as shown in FIG. 17H. If a portion of a gate electrode layer extends below the bottom surface 173 of the semiconductor layer 105, an electrical short can happen between the gate electrode layer and the conductive feature 196 (FIG. 21). The electrical short can lead to reliability issues such as time-dependent dielectric breakdown (TDDB). Thus, with the end 182 of the first gate electrode layer 178 located at a level above the plane defined by the bottom surface 173 of the semiconductor layer 105, the risk of electrical short between the first gate electrode layer 178 and the conductive feature 196 (FIG. 21) is reduced, leading to reduced TDDB. In some embodiments, the end 182 of the first gate electrode layer 178 may be located at a level between the plane defined by the bottom surface 173 of the semiconductor layer 105 and a plane defined by the top surface 170 of the semiconductor layer 105.

FIGS. 18A-18C are enlarged views of the region 200 of FIG. 16B showing various stages of manufacturing the semiconductor device structure 100, in accordance with alternative embodiments. FIG. 18A shows the semiconductor device structure 100 after the manufacturing stage shown in FIG. 17D. As shown in FIG. 18A, instead of forming the second dielectric layer 172, which includes the same material as the first dielectric layer 159, a second dielectric layer 180 is formed in the openings 171 (FIG. 17D), on portions of the dielectric features 161 (or the dielectric features 127 shown in FIG. 16B), on the semiconductor layer 105, and around the first semiconductor layers 106. The second dielectric layer 180 may include an oxygen-containing layer, such as an oxide layer. In some embodiments, the second dielectric layer 180 includes $TiO_2$, $AlO_x$, $HfO_x$, or $ZrO_x$. For example, the second dielectric layer 180 is made of $TiO_2$, $Al_2O_3$, $HfO_2$, or $ZrO_2$. The second dielectric layer 180 includes a material different from the first dielectric layer 159.

Next, as shown in FIG. 18B, portions of the second dielectric layer 180 and the first dielectric layer 159 disposed above the level of the bottom surface 173 of the semiconductor layer 105 are removed. Because of the second dielectric layer 180 is made of a different material from the first dielectric layer 159, the removal of the portions of the second dielectric layer 180 may be performed by a selective etch process, such as a selective dry or wet etch process. The etchant used in the selective etch process may remove the portions of the second dielectric layer 180 at a first rate and remove the portions of the first dielectric layer 159 at a second rate slower than the first rate. Due to the selective etch process, over-etching of the first dielectric layer 159 is minimized. The portions of the second dielectric layer 180 formed in the openings 171 in the first dielectric layer 159 are not removed by the selective etch process. As a result, an isolation structure 190 including the first dielectric layer 159 and second dielectric layer 180 formed therein is disposed between the level of the bottom surface 173 of the semiconductor layer 105 and the level of the substrate portion 116/insulating material 118.

The isolation structure 190 may have a thickness ranging from about 6 nm to about 13 nm. The thickness of the isolation structure 190 is defined by the thickness of the sacrificial semiconductor layer 107. The isolation structure 190 isolates the first gate electrode layer 178 (FIG. 17H) and the conductive feature 196 (FIG. 21). Furthermore, the isolation structure 190 isolates the conductive feature 196 (FIG. 21) and the S/D epitaxial feature 146 (FIG. 21). Thus, if the thickness of the isolation structure 190 is less than about 6 nm, the isolation structure 190 may not be sufficient to isolate the materials. On the other hand, if the thickness of the isolation structure 190 is greater than about 13 nm, the manufacturing cost is increased without significant advantage. Next, as shown in FIG. 18C, the gate dielectric layer 176 and the first gate electrode layer 178 are formed, which can be done by the same processes as described in FIG. 17H above.

Figure 19:
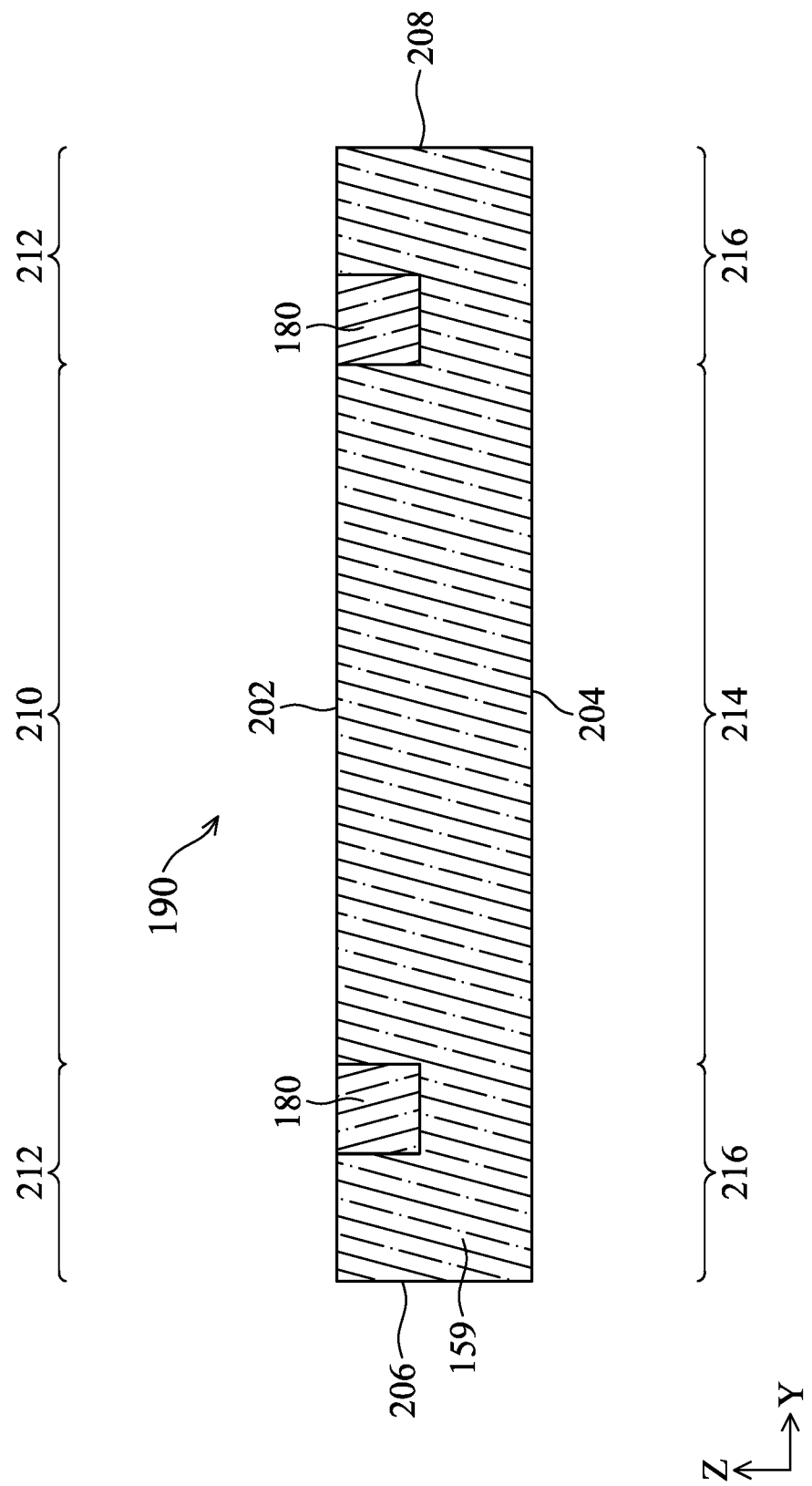
FIG. 19 is an enlarged view of an isolation structure, in accordance with some embodiments.

FIG. 19 is an enlarged view of the isolation structure 190 shown in FIG. 18C, in accordance with some embodiments. As shown in FIG. 19, the isolation structure 190 includes the first dielectric layer 159 and the second dielectric layer 180 formed in the first dielectric layer 159. The isolation structure 190 includes a first surface 202, a second surface 204 opposite the first surface 202, a third surface 206 connecting the first surface 202 and the second surface 204, and a fourth surface 208 opposite the third surface 206 and connecting first surface 202 and the second surface 204. The first surface 202 includes two different materials of the first and second dielectric layers 159, 180. The first surface 202 may be substantially planar and may include an inner portion 210 and an outer portion 212. The outer portion 212 may include two different materials, such as the material of the first dielectric layer 159 and the material of the second dielectric layer 180. The inner portion 210 may be in contact with the semiconductor layer 105 (FIG. 18C) (or the native oxide layer formed on the semiconductor layer 105). The outer portion 212 maybe in contact with a portion of the gate dielectric layer 176 (FIG. 18C). For example, two different materials of the outer portion 212 may be both in contact with the gate dielectric layer 176 (FIG. 18C). The second surface 204 includes an inner portion 214 and an outer portion 216. The inner portion 214 may be in contact with the substrate portion 116 (FIG. 18C) (or the native oxide layer formed on the semiconductor layer 105). The outer portion 216 may be in contact with the insulating material 118 (FIG. 18C). The third and fourth surfaces 206, 208 may be in contact with the dielectric features 161 (FIG. 18C) (or the dielectric features 127 shown in FIG. 16B). One or more of the first, second, third, and fourth surfaces, 202, 204, 206, 208 may be planar or non-planar. In some embodiments, the second surface 204 is non-planar as a result of the top surface 111 (FIG. 4) of the insulating material 118 (FIG. 4) below the level of the top surface of the substrate portion 116 (FIG. 4). The isolation layer 174 may have the same surfaces with the exception that the first surface 202 includes a single material.

Figure 20:
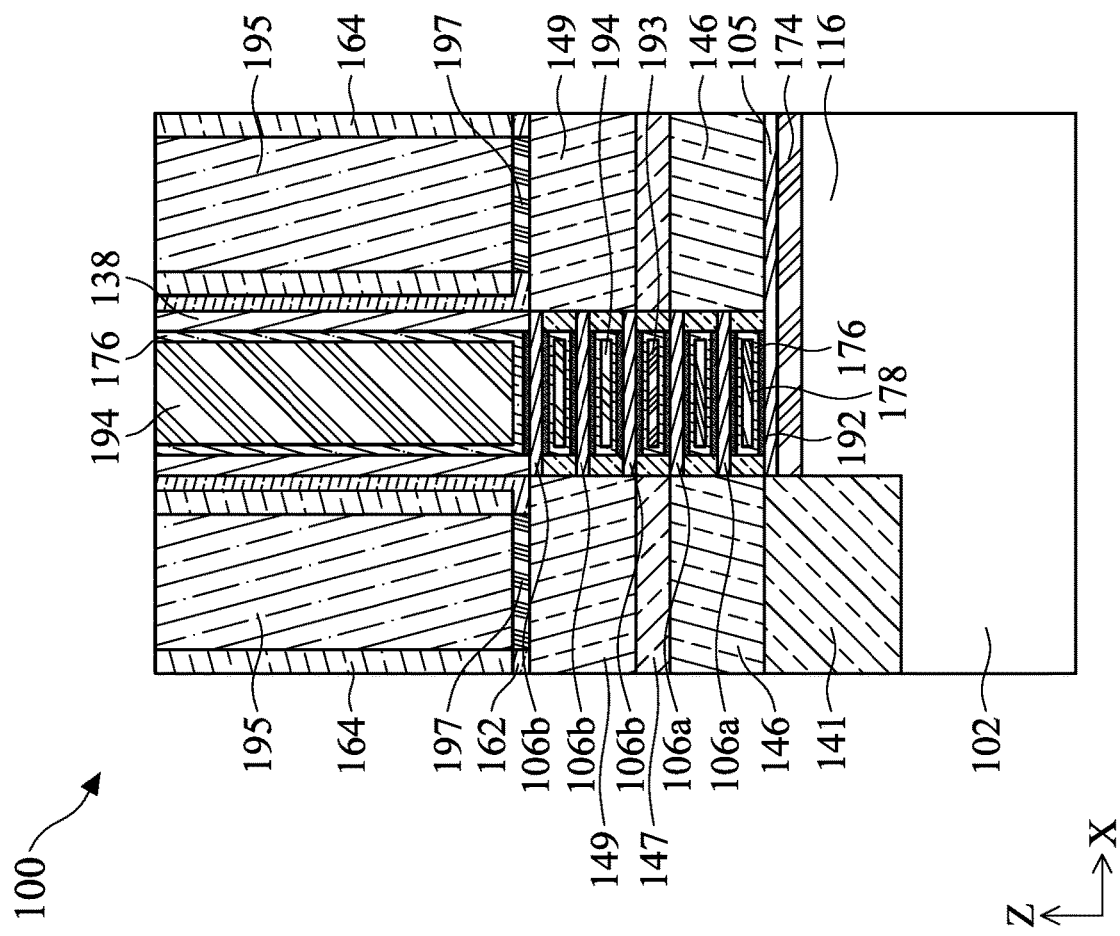
FIG. 20 is a cross-sectional side view of a stage of manufacturing the semiconductor device structure taken along line A-A of FIG. 8, in accordance with some embodiments.

FIG. 20 is a cross-sectional side view of a stage of manufacturing the semiconductor device structure taken along line A-A of FIG. 8, in accordance with some embodiments. FIG. 20 shows the semiconductor device structure 100 after the manufacturing stage shown in FIG. 17H or FIG. 18C. As shown in FIG. 18A, after the first gate electrode layer 178 is formed, a gate isolation layer 193 is formed over the first gate electrode layer 178 and between the topmost first semiconductor layer 106a and the bottommost first semiconductor layer 106b. The gate isolation layer 193 includes one or more layers of dielectric material, such as a metal oxide, for example a refractory metal oxide. The gate isolation layer 193 may be formed by PVD, CVD, PECVD, ALD, electro-plating, or other suitable method. The gate isolation layer 193 may be formed by first forming a dielectric layer filling the opening 160 (FIG. 16A), followed by an etch back process to recess the dielectric layer to a level of the bottom surface of the bottommost first semiconductor layer 106b.

A second gate electrode layer 194 is formed over the gate isolation layer 193. The second gate electrode layer 194 is formed on the gate dielectric layer 176 to surround a portion of each first semiconductor layer 106b. The second gate electrode layer 194 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The second gate electrode layer 194 may be formed by PVD, CVD, ALD, electro-plating, or other suitable method. The first gate electrode layer 178 and the second gate electrode layer 194 may include the same material or different materials. In some embodiments, the second gate electrode layer 194 includes an n-type gate electrode layer such as TiAlC, TaAlC, TiSiAlC, TiC, TaSiAlC, or other suitable material, and the second gate electrode layer 194 is a gate electrode layer of an NFET.

After forming the second gate electrode layer 194, conductive contacts 195 may be formed in the ILD layer 164, as shown in FIG. 20. Silicide layers 197 may be formed between the conductive contacts and the S/D epitaxial features 149. The conductive contacts 195 may include a material having one or more of Ru, Mo, Co, Ni, W, Ti, Ta, Cu, Al, TiN and TaN, and may be formed by any suitable process, such as PVD, ECP, or CVD.

It is understood that the semiconductor device structure 100 may undergo further complementary metal oxide semiconductor (CMOS) and/or back-end-of-line (BEOL) processes to form various features such as lines, vias, interconnect metal layers, dielectric layers, passivation layers, etc. After forming the various features on the front side of the semiconductor device structure 100, the semiconductor device structure 100 may be flipped over for back side processes.

As shown in FIG. 21, after flipping over the semiconductor device structure 100, the substrate 102, the substate portion 116, and the sacrificial layers 141 are removed and replaced with the conductive feature 196. A silicide layer 198 may be formed between the S/D epitaxial feature 146 and the conductive feature 196. The conductive feature 196 may include an electrically conductive material, such as a metal. In some embodiments, the conductive feature 196 includes the same material as the conductive contact 195. The conductive feature 196 electrically connects one of the S/D epitaxial feature 146 of a pair of the S/D epitaxial features 146 to a backside power rail (e.g., positive voltage VDD or negative voltage VSS). For example, a source epitaxial feature 146 may be electrically connected to the conductive feature 196, while a drain epitaxial feature 146 is isolated from the conductive feature 196 by the isolation layer 174 (or the isolation structure 190). With the isolation layer 174 (or the isolation structure 190), the conductive feature 196 is self-aligned to the S/D epitaxial feature 146 due to the etch selectivity between the isolation layer 174 and the sacrificial layer 141.

As described in FIG. 17H, the isolation layer 174 (or the isolation structure 190) isolates the conductive feature 196 and the first gate electrode layer 178, because the substrate portion 116 shown in FIG. 17H is replaced with the conductive feature 196. As shown in FIG. 21, the bottom surface 173 of the semiconductor layer 105 faces the isolation layer 174 (or the isolation structure 190), and the top surface 170 of the semiconductor layer 105 faces the S/D epitaxial feature 146. In some embodiments, one of the S/D epitaxial feature 146 of a pair of S/D epitaxial features 146 is disposed on and in contact with the top surface 170 of the semiconductor layer 105. In some embodiments, the conductive feature 196 is in contact with the isolation layer 174 (or the isolation structure 190), which is in contact with the bottom surface 173 of the semiconductor layer 105.

The present disclosure provides a semiconductor device structure 100 including an isolation layer 174 or an isolation structure 190 that electrically isolates a first gate electrode layer 178 and a conductive feature 196. Furthermore, the isolation layer 174 or the isolation structure 190 enables an end 182 of the first gate electrode layer 178 to be located at a level above a plane defined by a bottom surface 173 of a semiconductor layer 105, which is further away from the conductive feature 196. The conductive feature 196 is also self-aligned to a S/D epitaxial feature 146. Some embodiments may achieve advantages. For example, the self-aligned conductive feature 196 that is further away from the first gate electrode layer 178 can reduce the risk of electrical short between the first gate electrode layer 178 and the conductive feature 196, leading to reduced TDDB.

An embodiment is a semiconductor device structure. The structure includes first and second dielectric features and a first semiconductor layer disposed between the first and second dielectric features. The first semiconductor layer has a first surface and a second surface opposite the first surface. The structure further includes an isolation layer disposed between the first and second dielectric features, and the isolation layer is in contact with the first and second dielectric features. The first semiconductor layer is disposed over the isolation layer. The structure further includes a gate dielectric layer disposed over the isolation layer and a gate electrode layer disposed over the gate dielectric layer. The gate electrode layer has an end extending to a level between a first plane defined by the first surface of the first semiconductor layer and a second plane defined by the second surface of the first semiconductor layer.

Another embodiment is a semiconductor device structure. The structure includes first and second dielectric features and an isolation structure disposed between the first and second dielectric features. The isolation structure includes a first surface having an inner portion and an outer portion, and the outer portion includes two materials. The isolation structure further includes a second surface opposite the first surface, a third surface connecting the first surface and the second surface, and a fourth surface opposite the third surface. The third surface is in contact with the first dielectric feature and the fourth surface is in contact with the second dielectric feature. The structure further includes a semiconductor layer disposed over the inner portion of the first surface of the isolation structure and a first gate electrode layer disposed over the inner and outer portions of the first surface of the isolation structure.

A further embodiment is a method. The method includes forming a first semiconductor layer, forming a plurality of second semiconductor layers over the first semiconductor layer, and forming a first dielectric feature and a second dielectric feature. The first semiconductor layer and the plurality of second semiconductor layers are disposed between the first dielectric feature and the second dielectric feature. The method further includes forming a first dielectric layer on the first and second dielectric features and surrounding the first semiconductor layer and the plurality of second semiconductor layers. A gap is formed between a first portion of the first dielectric layer disposed on the first and second dielectric features and a second portion of the first dielectric layer surrounding the first semiconductor layer and the plurality of second semiconductor layers. The method further includes forming a mask material in the gap and removing a portion of the mask material. A remaining mask material is substantially level with a top surface of the first semiconductor layer. The method further includes removing a portion of the first dielectric layer over the level of the top surface of the first semiconductor layer, removing the remaining mask material to form openings in a remaining first dielectric layer, forming a second dielectric layer in the openings, and forming a gate electrode layer surrounding the plurality of second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming a first semiconductor layer;
    forming a plurality of second semiconductor layers over the first semiconductor layer;
    forming a first dielectric feature and a second dielectric feature, wherein the first semiconductor layer and the plurality of second semiconductor layers are disposed between the first dielectric feature and the second dielectric feature;
    forming a first dielectric layer on the first and second dielectric features and surrounding the first semiconductor layer and the plurality of second semiconductor layers, wherein a gap is formed between a first portion of the first dielectric layer disposed on the first and second dielectric features and a second portion of the first dielectric layer surrounding the first semiconductor layer and the plurality of second semiconductor layers;
    forming a mask material in the gap;
    removing a portion of the mask material, wherein a remaining mask material is substantially level with a top surface of the first semiconductor layer;
    removing a portion of the first dielectric layer over the level of the top surface of the first semiconductor layer;
    removing the remaining mask material to form openings in a remaining first dielectric layer;
    forming a second dielectric layer in the openings; and
    forming a gate electrode layer surrounding the plurality of second semiconductor layers.

2. The method of claim 1, further comprising forming a liner in the gap, wherein the mask material is formed on the liner.

3. The method of claim 2, further comprising:
    removing a portion of the liner after removing the portion of the mask material; and
    removing a remaining liner after removing the remaining mask material.

4. The method of claim 1, further comprising:
    forming first and second source/drain epitaxial features, wherein the first source/drain epitaxial feature is in contact with the first semiconductor layer, and the first and second source/drain epitaxial features are in contact with at least one second semiconductor layer of the plurality of second semiconductor layers; and forming a conductive feature, wherein the first and second dielectric layers and the first semiconductor layer are disposed between the conductive feature and the first source/drain epitaxial feature and between the conductive feature and the gate electrode layer.

5. A method, comprising:

forming a first dielectric layer between a first dielectric feature and a second dielectric feature, wherein the first dielectric layer comprises a first portion in contact with the first and second dielectric features and a second portion surrounding a first semiconductor layer disposed between the first and second dielectric features;

forming a mask material between the first portion of the first dielectric layer and the second portion of the first dielectric layer;

recessing the mask material;

removing portions of the first and second portions of the first dielectric layer located over a level of a remaining mask material;

removing the remaining mask material; and forming a second dielectric layer over the first semiconductor layer, wherein the first semiconductor layer is surrounded by the second dielectric layer and the second portion of the first dielectric layer.

6. The method of claim 5, wherein the second portion of the first dielectric layer surrounds a second semiconductor layer disposed over the first semiconductor layer prior to forming the mask material.

7. The method of claim 6, wherein a first distance is between the first portion and the second portion of the first dielectric layer, a second distance is between the second portion of the first dielectric layer surrounding the first semiconductor layer and the second portion of the first dielectric layer surrounding the second semiconductor layer, and the first distance is substantially greater than the second distance.

8. The method of claim 7, further comprising forming a liner on the first and second portions of the first dielectric layer, wherein the mask material is formed on the liner.

9. The method of claim 8, wherein the liner fills a space defined by the second distance, and the mask material is formed between a first portion of the liner in contact with the first portion of the first dielectric layer and a second portion of the liner in contact with the second portion of the second dielectric layer.

10. The method of claim 8, further comprising recessing the liner prior to removing the remaining mask material.

11. The method of claim 10, further comprising removing the liner after removing the remaining mask material.

12. The method of claim 5, wherein the first and second dielectric layers comprise a same material.

13. The method of claim 5, wherein the first and second dielectric layers comprise different materials.

14. The method of claim 5, further comprising removing portions of the second dielectric layer to form an isolation layer, wherein the isolation layer comprises a portion of the first dielectric layer and a portion of the second dielectric layer.

15. A method, comprising:

forming a first semiconductor layer over a substrate;

forming a plurality of second semiconductor layers over the first semiconductor layer;

forming a sacrificial gate stack over a first portion of the first semiconductor layer and a first portion of the plurality of second semiconductor layers;

removing a second portion of the plurality of second semiconductor layers to expose a second portion of the first semiconductor layer and a third portion of the first semiconductor layer located on opposite sides of the sacrificial gate stack;

removing the second portion of the first semiconductor layer and a portion of the substrate to expose a portion of the substrate;

forming a sacrificial layer on the exposed portion of the substrate;

forming a first source/drain epitaxial feature on the sacrificial layer and a second source/drain epitaxial feature on the third portion of the first semiconductor layer;

removing the sacrificial gate stack; and forming an isolation layer under the first semiconductor layer, wherein the isolation layer extends below the second source/drain epitaxial feature.

16. The method of claim 15, wherein the isolation layer is formed by:

depositing a first dielectric layer surrounding the first semiconductor layer and the plurality of second semiconductor layers;

recessing the first dielectric layer;

depositing a second dielectric layer on the recessed first dielectric layer; and recessing the second dielectric layer.

17. The method of claim 16, further comprising forming a liner on the first dielectric layer and forming a mask material on the liner prior to recessing the first dielectric layer.

18. The method of claim 17, further comprising recessing the mask material prior to recessing the first dielectric layer.

19. The method of claim 18, further comprising removing the liner and the recessed mask material.

20. The method of claim 15, further comprising forming a gate electrode layer surrounding the plurality of second semiconductor layers.

* * * * *